US011022851B2

(12) United States Patent
Koide

(10) Patent No.: US 11,022,851 B2
(45) Date of Patent: Jun. 1, 2021

(54) DISPLAY DEVICE

(71) Applicant: Japan Display Inc., Tokyo (JP)

(72) Inventor: Gen Koide, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 16/854,436

(22) Filed: Apr. 21, 2020

(65) Prior Publication Data
US 2020/0249787 A1 Aug. 6, 2020

Related U.S. Application Data

(63) Continuation of application No. 15/956,329, filed on Apr. 18, 2018, now Pat. No. 10,664,094.

(30) Foreign Application Priority Data

Apr. 20, 2017 (JP) .............................. JP2017-083862

(51) Int. Cl.
*G02F 1/1345* (2006.01)
*H01L 27/12* (2006.01)
(Continued)

(52) U.S. Cl.
CPC ........ *G02F 1/13454* (2013.01); *G02F 1/1368* (2013.01); *G02F 1/13338* (2013.01);
(Continued)

(58) Field of Classification Search
CPC ............... G02F 1/13454; G02F 1/1368; G02F 1/136286; G02F 1/13338; G06F 3/04164; G06F 3/04166; G06F 3/0443; G06F 2203/04107; G06F 2203/04102; G06F 2203/04101; H01L 27/1222; H01L 27/124; H01L 27/3279; H01L 27/323; H01L 27/3262; H01L 27/3276; H01L 29/78696
See application file for complete search history.

(56) References Cited

U.S. PATENT DOCUMENTS

2011/0057190 A1* 3/2011 Kimura ................. H01L 27/124
257/59
2011/0175894 A1* 7/2011 Wakimoto .......... G02F 1/13306
345/212

(Continued)

FOREIGN PATENT DOCUMENTS

JP 2015-230599 A 12/2015

*Primary Examiner* — Brent D Castiaux
(74) *Attorney, Agent, or Firm* — K&L Gates LLP

(57) ABSTRACT

A display device is provided and includes substrate; first and second common electrodes arranged on the substrate; pixel electrodes arranged over first and second common electrodes; insulating layer arranged between pixel, first common, and second common electrodes; first line having first and second terminals, first terminal connected to first common electrode; second line having first and second terminals, first terminal connected to second common electrode; first transistor connected to second terminal of first line; and second transistor connected to second terminal of the second line, wherein first and second common and pixel electrodes are arranged in display area, first and second transistor are arranged outside display area, second line is longer than first line, and channel width of first transistor is smaller than channel width of second transistor.

10 Claims, 18 Drawing Sheets

(51) Int. Cl.
    *G02F 1/1368*     (2006.01)
    *G02F 1/1362*     (2006.01)
    *G02F 1/1333*     (2006.01)
    *G06F 3/041*     (2006.01)
    *G06F 3/044*     (2006.01)
    *H01L 27/32*     (2006.01)
    *H01L 29/786*     (2006.01)

(52) U.S. Cl.
    CPC ...... G02F 1/136286 (2013.01); G06F 3/0443 (2019.05); G06F 3/04164 (2019.05); G06F 3/04166 (2019.05); H01L 27/124 (2013.01); H01L 27/1222 (2013.01); *G06F 2203/04101* (2013.01); *G06F 2203/04102* (2013.01); *G06F 2203/04107* (2013.01); *H01L 27/323* (2013.01); *H01L 27/3262* (2013.01); *H01L 27/3276* (2013.01); *H01L 27/3279* (2013.01); *H01L 29/78696* (2013.01)

(56) References Cited

U.S. PATENT DOCUMENTS

| | | |
|---|---|---|
| 2012/0206395 A1 | 8/2012 | Misaki |
| 2013/0335376 A1 | 12/2013 | Lee |
| 2015/0002448 A1 | 1/2015 | Brunet et al. |
| 2015/0317020 A1 | 11/2015 | Watanabe et al. |
| 2015/0355765 A1* | 12/2015 | Fukushima ........... G06F 3/0443 345/174 |
| 2016/0117049 A1 | 4/2016 | Sagawai et al. |
| 2017/0185194 A1 | 6/2017 | Kim et al. |
| 2017/0357355 A1 | 12/2017 | Fukushima et al. |

* cited by examiner

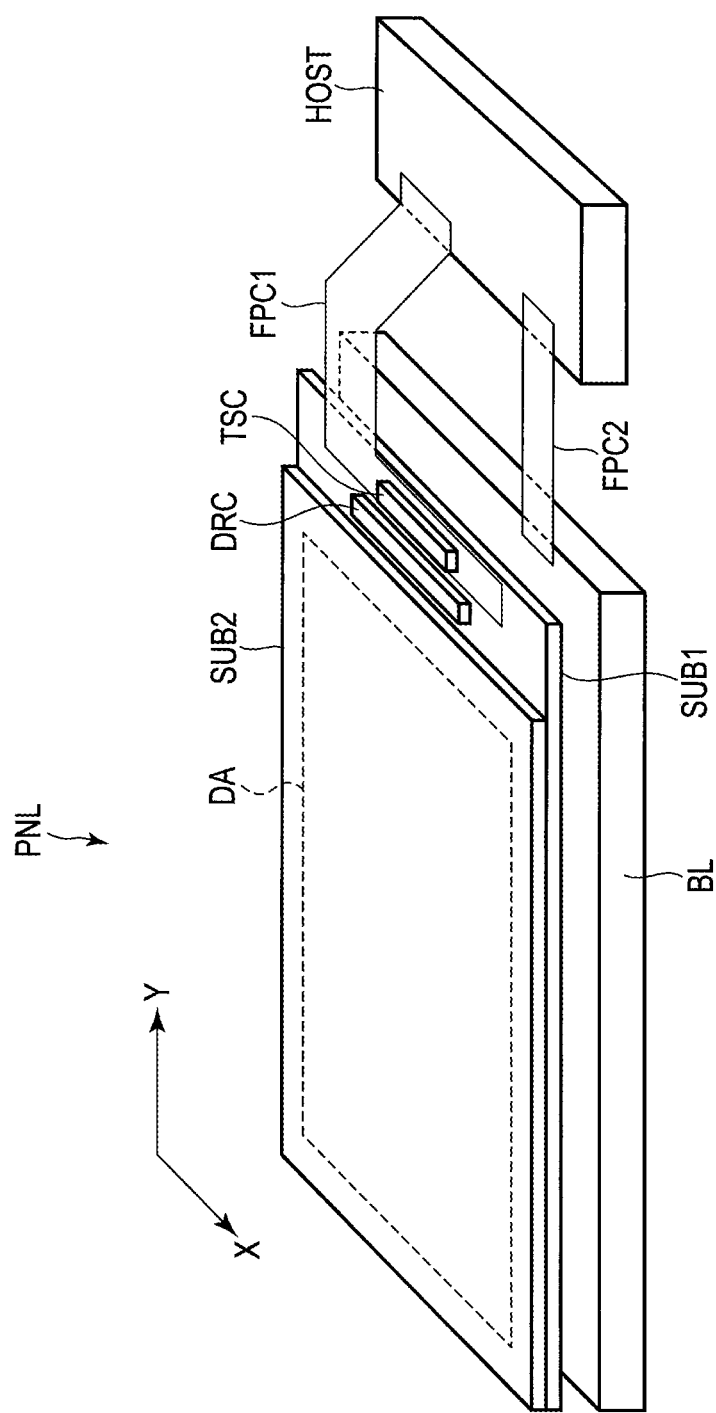
F I G. 1

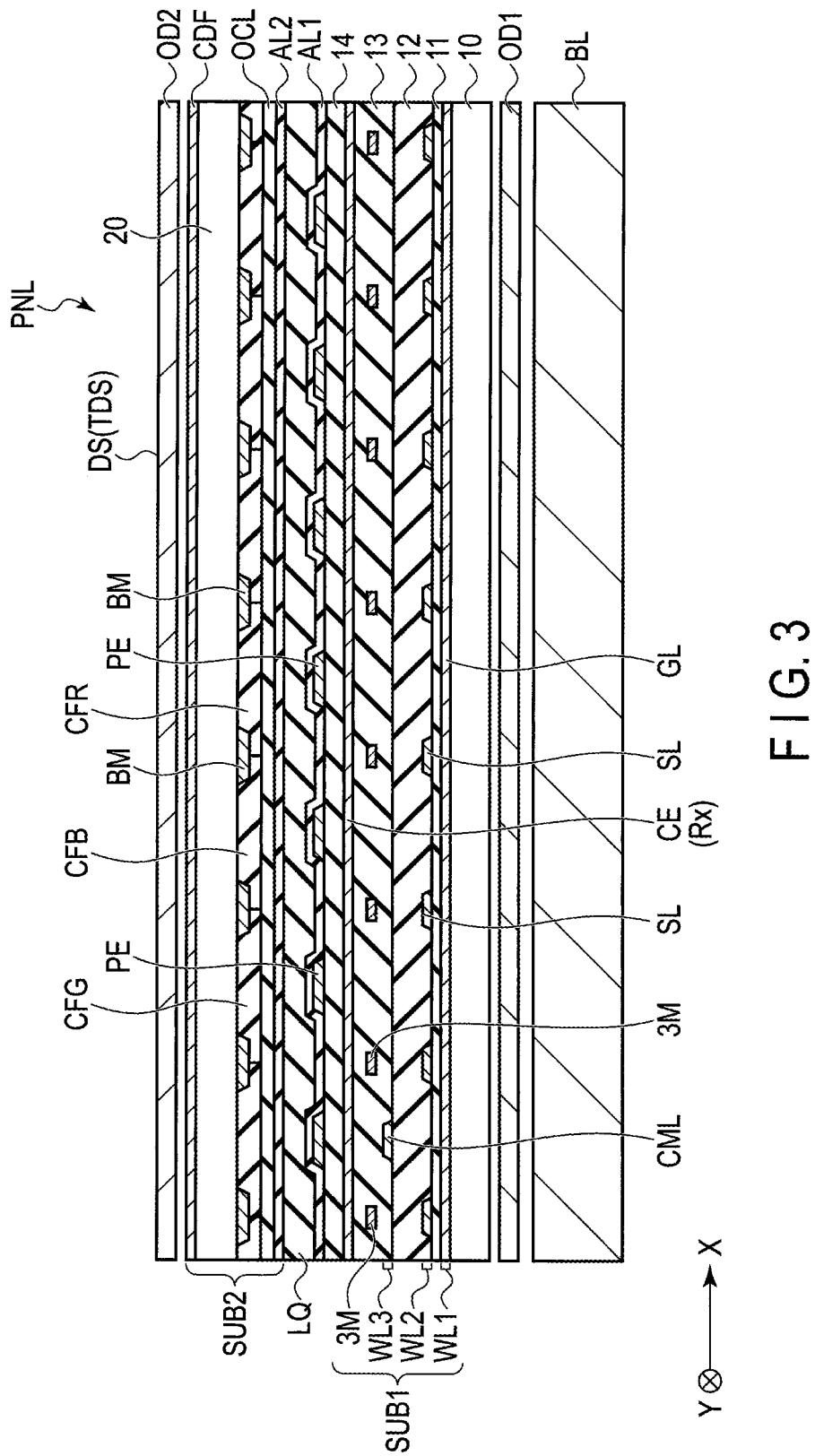
F I G. 3

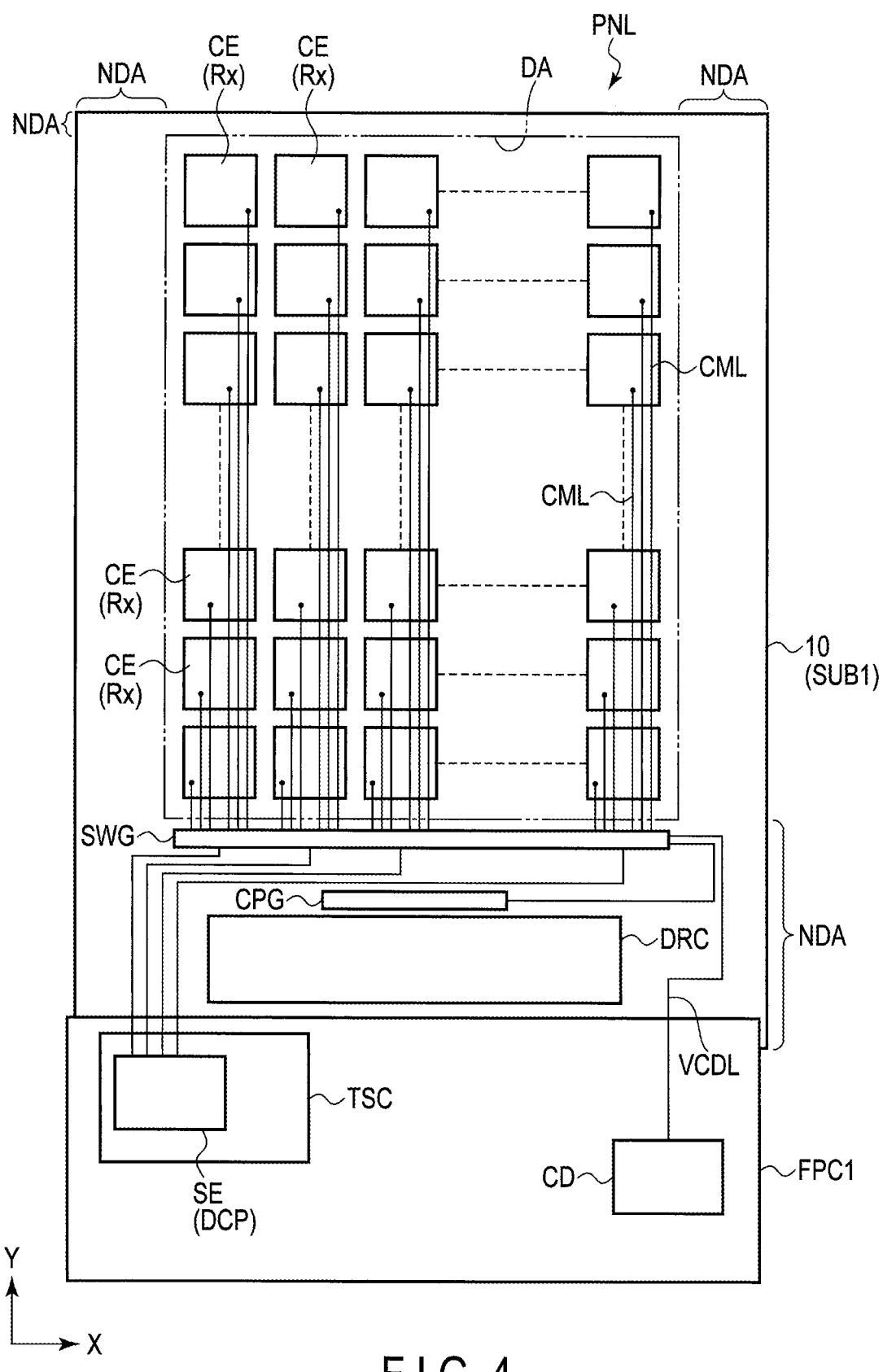
F I G. 4

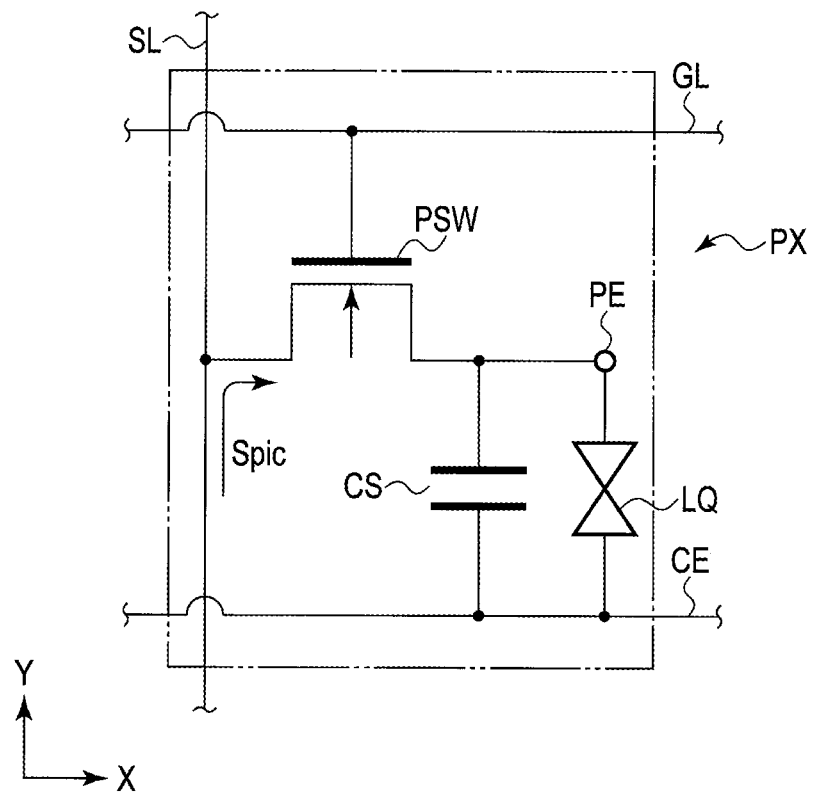
F I G. 5
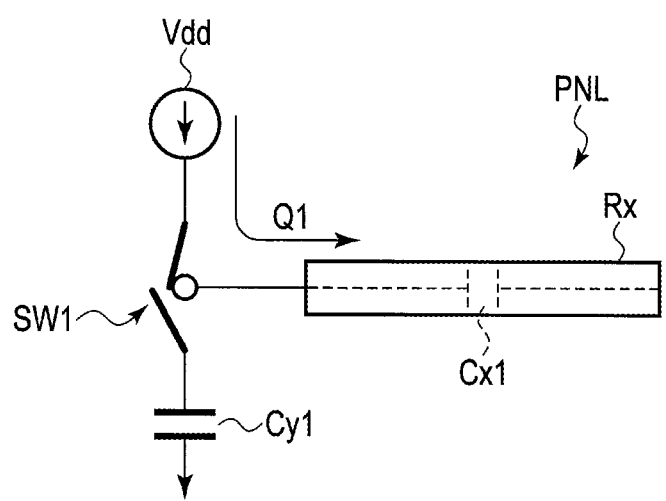
F I G. 6

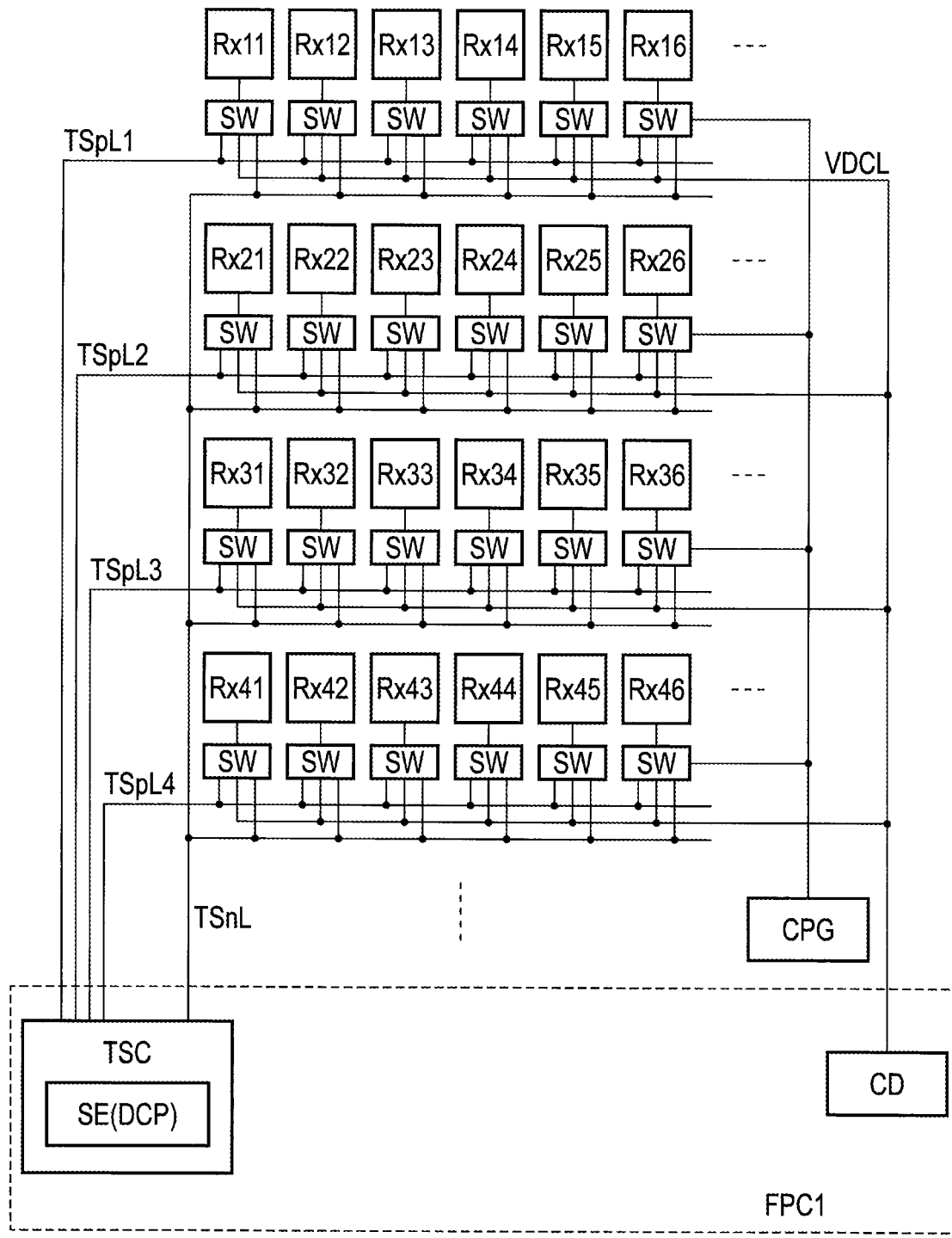
F I G. 12

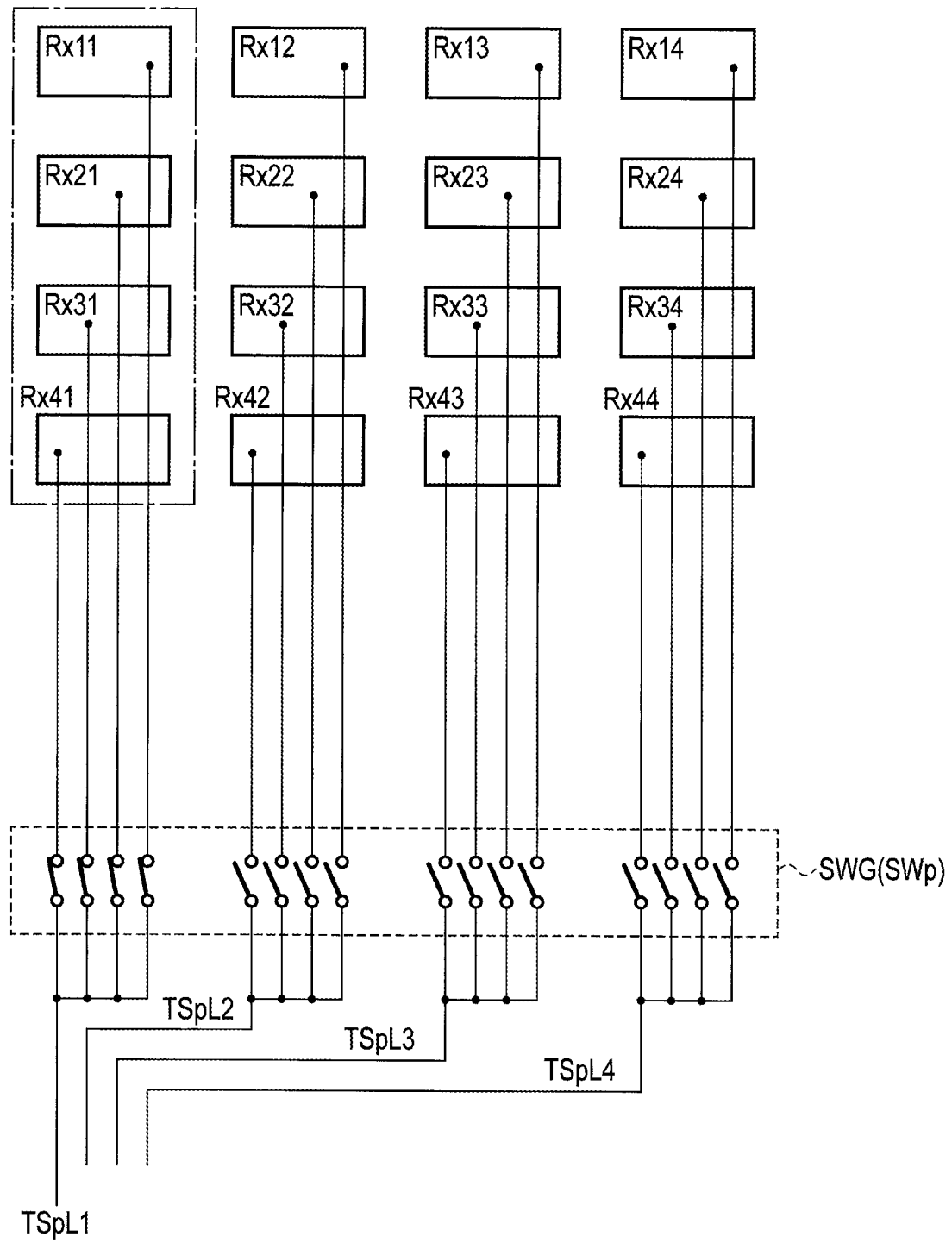
F I G. 18

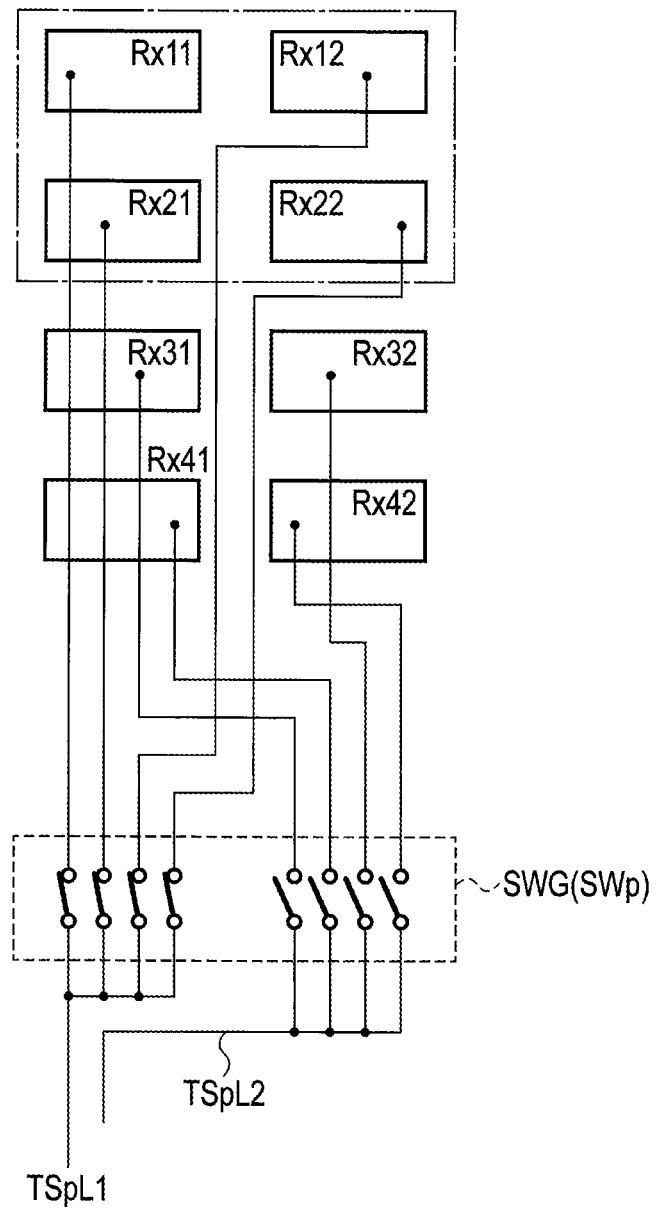
F I G. 20

DISPLAY DEVICE

CROSS-REFERENCE TO RELATED APPLICATIONS

This application is a continuation application of U.S. patent application Ser. No. 15/956,329 filed on Apr. 18, 2018, which is based upon and claims the benefit of priority from Japanese Patent Application No. 2017-083862, filed Apr. 20, 2017, the entire contents of which are incorporated herein by reference.

FIELD

Embodiments described herein relate generally to a display device with an inputting function.

BACKGROUND

Mobile terminals such as smart phones, tablet PCs and notebook computers have been prevalent. A mobile terminal includes a flat display device using liquid crystal or organic EL elements. The display device is connected to a host device which outputs image data, commands, and the like. The display device includes a display panel and a driver processing commands and driving the display panel.

In the display device, pixels two-dimensionally arrayed on the display panel include a common electrode and a pixel electrode, and the liquid crystal or organic EL elements are arranged between the common electrode and the pixel electrode. When the driver writes a pixel signal to the pixels on the display panel, the liquid crystal or organic EL elements arranged between the common electrode and the pixel electrode are controlled and an image is thereby displayed.

Display devices capable of detecting an inputting object such as a finger and a touch pen (also called a stylus) approaching or contacting the screen have been widely employed. The operation of allowing the inputting object to approach or contact the screen is called a touch operation or a touch, and the detection of a position of the inputting object is called touch detection. Examples of the touch detection include various types such as an optical type, a resistive type, a capacitive type, and an electromagnetic induction type. The capacitive type utilizes a feature that the electrostatic capacitance between a pair of electrodes (called a drive electrode and a detection electrode) is varied by approach or contact of the inputting object, and has benefits that the structure is comparatively simple and that the power consumption is small.

If the number of drive electrodes and the detection electrodes is increased to improve the performance of the image display operation and the touch detection operation, in the display device with the touch detection function, a layout of lines connected to the electrodes or a terminal layout of a semiconductor chip controlling the image display operation and the touch detection operation becomes complicated. In accordance with this, the number of terminals of the semiconductor chip is increased, the size of the semiconductor chip becomes larger, and the structure becomes complicated.

SUMMARY

The present application generally relates to a display device.

According to one embodiment, a display device includes a display unit including electrodes, a touch sensor configured to supply drive signals to the electrodes and receive signals from the electrodes, and a switch circuit group including transistors connected between the touch sensor and the electrodes. The transistors include a first transistor connected to a first electrode via a line of a first length and a second transistor connected to a second electrode via a line of a second length longer than the first length. The channel width of the first transistor is smaller than a channel width of the second transistor.

BRIEF DESCRIPTION OF THE DRAWINGS

FIG. 1 is a perspective view showing a schematic configuration of an example of a display device according to an embodiment.

FIG. 3 is a cross-sectional view showing an example of a first substrate SUB1 of the display device.

FIG. 4 is a plan view showing an example of arrangement of common electrodes CE of the display device.

FIG. 5 is a circuit diagram showing an example of a pixel PX of the display device.

FIG. 6 is a circuit diagram showing an example of self-capacitive touch detection.

FIG. 12 is a circuit diagram showing an example of an operation of a switch circuit group SWG for CDM drive.

FIG. 18 is a circuit diagram showing an example of a layout of the common electrodes and the switch circuit group SWG.

FIG. 20 is a circuit diagram showing yet another example of a layout of the common electrodes and the switch circuit group SWG.

DETAILED DESCRIPTION

Figure 2:
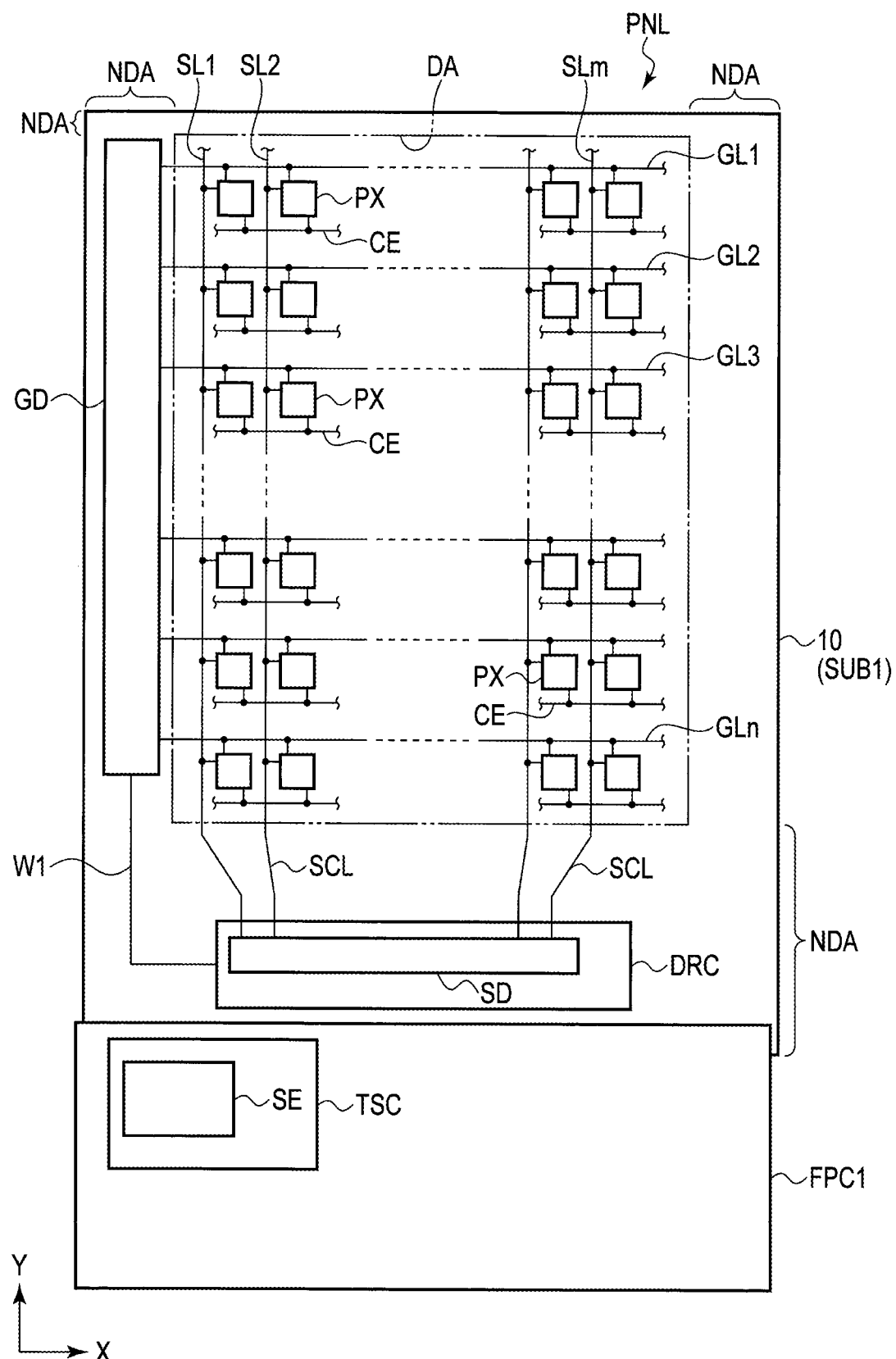
FIG. 2 is a plan view showing an example of the display device.

Embodiments will be described hereinafter with reference to the accompanying drawings. The disclosure is merely an example and is not limited by contents described in the embodiments described below. Modification which is easily conceivable by a person of ordinary skill in the art comes within the scope of the disclosure as a matter of course. In order to make the description clearer, the sizes, shapes and the like of the respective parts may not be illustrated as they are, but may be changed and illustrated schematically in the drawings, and hatching attached to distinguish structures may be omitted. Constituent elements corresponding to each other in a plurality of drawings may be denoted by similar reference numerals and their detailed descriptions may be omitted unless necessary.

In general, according to one embodiment, a display device includes a display unit including electrodes two-dimensionally arrayed on a substrate, a touch sensor configured to supply drive signals for touch detection to the electrodes and receiving the signals from the electrodes, and a switch circuit including transistors connected between the touch sensor and the electrodes to select at least one of the electrodes. The transistors include a first transistor connected to a first electrode of the electrodes via a line of a first length and a second transistor connected to a second electrode of the electrodes via a line of a second length longer than the first length. A channel width of the first transistor is smaller than a channel width of the second transistor.

The display device equipped with the touch detection function includes an on-cell type (also called an external type) in which the display device and the touch panel implementing the touch function are produced separately and the touch panel is bonded to the screen of the display device, and an in-cell type (also called a built-in type) in which the display device and the touch panel are integrated. The in-cell type display device includes a device in which several or all parts having the touch detection function also serve as several or all parts having the display function or a device in which a component having the touch detection function and a component having the display function do not serve each other. In the in-cell type display device, for example, the detection electrode is formed between a color filter and a polarizer, and a common electrode formed on a TFT substrate is also served as a drive electrode. Since the in-cell type display device includes no external touch panel, the display device is entirely slim and lightweight, and visibility of the display is also improved. Embodiments of the in-cell type display device will be explained. However, the embodiments can also be applied to an on-cell type display device.

Examples of the touch detection include various types such as an optical type, a resistive type, a capacitive type, and an electromagnetic induction type. The capacitive type utilizes a feature that the electrostatic capacitance between a pair of electrodes (called a drive electrode and a detection electrode) is varied by approach or contact of the inputting object, and has benefits that the structure is comparatively simple and that the power consumption is small. A display device equipped with a capacitive touch detection function will be explained as the embodiments. However, the embodiments can be applied to not only the capacitive type touch detection, but also the touch detection of the other types such as an electromagnetic induction type.

The capacitive type includes a mutual-capacitive type (mutual capacitive sensing) for detecting an electrostatic capacitance between two detection electrodes opposed to be spaced apart from each other and a self-capacitive type (self-capacitive sensing) for detecting an electrostatic capacitance between one detection electrode and, for example, a reference electrode having a reference potential such as a ground potential. The self-capacitive sensing will be explained as an example, but the embodiments can also be applied to a display device which executes mutual-capacitive touch detection. In the self-capacitive sensing, the reference electrode may be a conductive pattern of being disposed around the detection electrode in a remote distance to form an electrostatic capacitance which can be detected between the reference electrode and the detection electrode. A path for supplying a fixed potential may be connected to the reference electrode. The shape and the like of the reference electrode are not particularly limited. The display device with the touch detection function is an aspect of the input device, and detects an input signal and calculates a touch position when a finger or an input instrument such as a stylus touches or approaches the touch surface. The touch position is coordinates of a point at which the input signal is detected, on the touch surface.

A liquid crystal display device, an organic EL display device, a plasma display device, and the like can be used as the display device and, the embodiments using the liquid crystal display device will be explained hereinafter as an example, but the embodiments can also be applied to the organic EL display device, the plasma display device, and the like. The display mode of the liquid crystal display device is largely classified into two modes in accordance with the direction of application of the electric field to vary the alignment of liquid crystal molecules of a liquid crystal layer which is a display function layer. The first mode is what is called a longitudinal electric field mode in which the electric field is applied in a thickness direction (or an out-of-plane direction). The longitudinal electric field mode includes, for example, twisted nematic (TN) mode, vertical alignment (VA) mode, and the like. The second mode is what is called a lateral electric field mode in which the electric field is applied in a plane direction (or an in-plane direction). The lateral electric field mode includes, for example, in-plane switching (IPS) mode, fringe field switching (FFS) mode which is a type of the IPS mode, and the like. The embodiments explained below can be applied to any one of the longitudinal electric field mode and the lateral electric field. The display device of the lateral electric field will be explained as the embodiments, but the embodiments can also be applied to the display device of the longitudinal electric field.

[First Embodiment]
[Schematic Configuration]

FIG. 1 is a perspective view showing an overall schematic configuration of an example of a display device equipped with a touch detection function according to the embodiment. The display device includes a display panel PNL including a touch detection mechanism, a touch sensing chip TSC, and a driver chip DRC. The display panel PNL includes a transparent first substrate SUB1 formed of glass, resin, and the like, a transparent second substrate SUB2 formed of glass, resin, and the like and disposed to be opposed to the first substrate SUB1, and a liquid crystal layer (not shown) disposed between the first substrate SUB1 and the second substrate SUB2. Since pixels (shown in FIG. 5) are disposed in two-dimensional array (also called a matrix) in the X direction and the Y direction on the first substrate SUB1, the first substrate SUB1 is also called a pixel substrate or an array substrate. The second substrate SUB2 is also called a counter-substrate. The display panel PNL is observed from the second substrate SUB2 side. For this reason, the second substrate SUB2 may be called an upper substrate while the first substrate SUB1 may be called a lower substrate.

The display panel PNL is shaped in a rectangular flat plate, and its shorter side is along an X direction and its longer side is along a Y direction. The first substrate SUB1 and the second substrate SUB2 are substantially the same in size of the shorter side but different in size of the lower side. The longer side of the first substrate SUB1 is larger than the longer side of the second substrate SUB2. Since a first shorter side of the first substrate SUB1 and a first shorter side of the second substrate SUB2 are aligned, a second shorter side of the first substrate SUB1 protrudes further than a second shorter side of the second substrate SUB2 in the Y direction. The driver chip DRC which drives the display panel PNL for image display is mounted on a portion of the first substrate SUB1 protruding further than the second substrate SUB2 in the Y direction. The driver chip DRC is also called a driver IC or a display controller IC. An area where the pixels are disposed in two-dimensional array is called a display area DA (or an active area), and a non-display area NDA other than the display area DA is also called a frame area.

The display device can be connected to a host device HOST. The display panel PNL and the host device HOST are connected to each other via two flexible printed circuits FPC1 and FPC2. The host device HOST is connected to the first substrate SUB1 via the flexible printed circuit FPC1. The touch sensing chip TSC which controls the touch detection is a Chip on Film (COF) chip disposed on the flexible printed circuit FPC1. The touch sensing chip TSC is also called a touch detector IC or touch controller IC. The touch sensing chip TSC may be a Chip on Glass (COG) chip which is not disposed on the flexible printed circuit FPC1, but on the first substrate SUB1.

The driver chip DRC and the touch sensing chip TSC are electrically connected to each other by means of the timing pulse, and the like and cooperate with respect to the operation timing. The driver chip DRC and the touch sensing chip TSC may not be constituted as different ICs, but as the same IC. In this case, the single IC may be disposed on the first substrate SUB1 or the flexible printed circuit FPC1. The driver chip DRC may also be disposed not on the first substrate SUB1, but on the flexible printed circuit FPC1.

A backlight unit BL serving as an illumination device which illuminates the display panel PNL is provided on the back side of the first substrate SUB1 (i.e., the back surface side of the display panel PNL). The host device HOST is connected to the backlight unit BL via a flexible printed circuit FPC2. Various types of backlight units can be employed as the backlight unit BL. For example, a light-emitting diode (LED), a cold-cathode tube (CCFL) and the like, can be used as the light source. An illumination device using a light guide disposed on the back surface side of the display panel PNL and an LED or a cold-cathode tube disposed on its side surface side can be employed as the backlight unit BL. An illumination device using a spot light source in which light emitting elements are aligned in plane on the back surface side of the display panel PNL can also be employed as the backlight unit BL. Not only the backlight, but a front light disposed on the display surface side of the display panel PNL can be used as the illumination device. If the display device is a reflective display device or if the display panel PNL employs organic EL, the illumination device may not be provided. The display device includes a secondary battery, a power circuit, and the like, though not illustrated in the drawing.

The example shown in FIG. 1 is a longitudinally elongated screen in which the length of the Y direction is larger than the length of the X direction and the X direction is set as the lateral direction, but may be applied to a laterally elongated screen in which the length of the X direction is larger than the length of the Y direction.

[Circuit Configuration]

FIG. 2 is a plan view showing an example of the display device according to the embodiments. FIG. 3 is a cross-sectional view showing an example of several parts of the display area DA. FIG. 4 is a plan view showing an example of arrangement of the common electrodes. FIG. 5 is an equivalent circuit diagram showing an example of a pixel. To facilitate viewing, constituent members of the display panel PNL will be shown in FIG. 2 and FIG. 4 separately. To illustrate an example of a positional relationship between a scanning line GL and a signal line SL in a thickness direction of the first substrate SUB1 in FIG. 3, a scanning line GL provided in a cross-section different from FIG. 3 will be shown together for convenience of explanations.

As shown in FIG. 2, the driver chip DRC includes a signal line driver SD which drives the display panel PNL. The touch sensing chip TSC includes a sensor SE including a capacitive-type touch detection function. The sensor SE includes a detection controller DCP (FIG. 4) which controls the touch detection operation and processes a signal output from a detection electrode Rx (shown in FIG. 4). A configuration of the sensor SE serving as the touch detection circuit and a detection method of the sensor SE will be explained later. The display device includes a control module provided outside the display panel PNL or the like and the control module is electrically connected to the display panel PNL via a flexible printed circuit FPC1, though not illustrated in the figure. The detection controller DCP may be disposed inside the driver chip DRC.

As shown in FIG. 3, the backlight unit BL is disposed on a back surface side of the first substrate SUB1. An optical element OD1 is provided between the backlight unit BL and the first substrate SUB1. The first substrate SUB1 includes an insulating substrate 10, insulating films 11, 12, 13, and 14, the common electrode CE (also called a detection electrode Rx), the pixel electrode PE, and a first alignment film AL1 The second substrate SUB2 includes a second alignment film AL2, an overcoat layer OCL, red, green, and blue color filters CFR, CFG, and CFB, a black matrix BM, an insulating substrate 20, and a conductive film CDF. A liquid crystal layer LQ serving as an electro-optical layer is disposed between the first substrate SUB1 and the second substrate SUB2. An optical element OD2 is disposed on a surface side of the second substrate SUB2. The surface of the optical element OD2 is a touch detection surface TDS or a display surface DS on which an image is displayed.

As shown in FIG. 4, the display panel PNL includes detection electrodes Rx disposed in a two-dimensional array in the first direction X and the second direction Y in the display area DA. The sensor SE detects variation in the electrostatic capacitance of each of the detection electrodes Rx, though the details are explained later. Since the detection electrodes Rx are provided inside the display panel PNL, the embodiments relate to an in-cell type display device equipped with the touch detection function. An example of a planar shape of the detection electrode Rx is a square, but may be an octagon formed by slightly cutting corners of a square, a shape formed by rounding corners of a square, or the like.

As shown in FIG. 2, the driver chip DRC is provided in a non-display area NDA outside the display area DA of the display panel PNL on the first substrate SUB1. The driver chip DRC includes a signal line driver SD which drives the liquid crystal layer LQ (shown in FIG. 3) serving as an electro-optical layer via wirings SCL and signal lines SL, and the like. As shown in FIG. 5, the signal line driver SD supplies a video signal Spic to the pixel electrode PE provided in the pixel PX via the wiring SCL and the signal line SL.

In the display area DA, m x n pixels PX are aligned in a two-dimensional array in the X direction and the Y direction. Each of m and n is an arbitrarily positive integer. The signal lines SL extending in the Y direction are spaced apart from each other and aligned in the X direction. "m" signal lines SL1, SL2, . . . SLm (generically called SL) are aligned in order of SL1, SL2, . . . SLm, from one side to the other side in the X direction. Ends of the signal lines SL drawn to the non-display area NDA outside the display area DA and are electrically connected to the driver chip DRC via connection wirings SCL for signal serving as connection wirings (also called connection leads).

The signal lines SL and the wirings SCL are video signal lines for transmitting video signals, but the signal lines SL and the wirings SCL can be distinguished in the following manner. The lines disposed inside the display area DA, of the signal transmission paths connected to the driver chip DRC to supply the video signals to the pixels PX, are called the signal lines SL, and the lines outside the display area DA are called the wirings SCL. The signal lines SL extend linearly in the Y direction, in parallel with one another. Since the wirings SCL are the lines for connecting the signal lines SL and the driver chip DRC, the wirings SCL include bent portions having an entirely fan shape, between the signal lines SL and the driver chip DRC.

The signal lines SL and the driver chip DRC may be connected directly via the wirings SCL or the other circuit may be disposed between the signal lines SL and the driver chip DRC. For example, an RGB select switch for selecting a red video signal, a green video signal or a blue video signal may be interposed between the signal lines SL and the driver chip DRC. The RGB select switch is, for example, a multiplexer circuit, which inputs signals formed by multiplexing the red video signal, the green video signal, and the blue video signal and selectively outputs the input video signals to signal lines SL for each color. In this case, the number of wirings SCL which connect the RGB select switch and the driver chip DRC is smaller than the number of signal lines SL.

A scanning line driver GD serving as a scanning signal output circuit for sequentially outputting scanning signals to the scanning lines GL is provided in the non-display area NDA on the first substrate SUB1. The driver chip DRC is connected to the scanning line driver GD via a wiring W1 to supply control signals such as a clock signal and an enable signal to the scanning line driver GD. The scanning line GL extending in the X direction are spaced apart from each other and aligned in the Y direction. "n" scanning lines GL1, GL2, . . . GLn (generically called GL) are aligned in order of GL1, GL2, . . . GLn, from one side to the other side in the Y direction. Ends of the scanning lines GL are drawn to the non-display area NDA outside the display area DA and connected to the scanning line driver GD. The scanning lines GL intersect the signal lines SL.

The scanning line driver GD may include, for example, shift register circuits (not shown) and a switch (also called a switching element) connected to the shift register circuit to select an electric potential supplied to the scanning line GL, based on the control signals. FIG. 2 shows an example in which the scanning line driver GD is disposed in one side in the X direction while a scanning line drive circuit is not disposed in the other side, but the layout of the scanning line driver GD can be variously modified. For example, the scanning line driver GD may be disposed on each of the sides in the X direction and the display area DA may be disposed between two scanning line drive circuits GD. A buffer circuit for shaping waveforms of the control signals may be connected between the driver chip DRC and the scanning line driver GD.

As shown in FIG. 4, the common electrodes CE are aligned in a two-dimensional array in the X direction and the Y direction. Common lines CML are connected to the common electrodes CE, respectively. The common electrodes CE are connected to a switch circuit group SWG via the common lines CML. A common electrode driver CD (also called common potential circuit) which drives the common electrodes CE during the image display is disposed on the flexible printed circuit FPC1 and is electrically connected to the common electrodes CE via a common potential supply line VCDL, the switch circuit group SWG, and the common lines CML.

In the embodiments, the common electrodes CE serve as the detection electrodes Rx for self-capacitive touch detection. For this reason, the common lines CML also has a function of lines for detected signal transmission for transmitting the signals detected by the detection electrodes Rx to the sensor SE.

Since the self-capacitive touch detection is executed by using the detection electrodes Rx, the common lines CML also has a function of the lines for signal transmission for inputting drive waveforms serving as write signals to the detection electrodes Rx, though explained later in detail.

The number of common electrodes CE may be equal to the number of pixels PX shown in FIG. 2 or may be smaller than the number of pixels PX. If the number of common electrodes CE which operate as the detection electrodes Rx is equal to the number of pixels PX, the resolution of the touch detection becomes substantially the same as the resolution of the display image. If the number of common electrodes CE is smaller than the number of pixels PX, the resolution of the touch detection is lower than the resolution of the display image but the number of common lines CML can be reduced. In general, the resolution of the display image is high as compared with the resolution of the touch detection. Therefore, the number of common electrodes CE may be smaller than the number of pixels PX. For example, a plane area of one detection electrode Rx is 4 mm$^2$ to 36 mm$^2$, one detection electrode Rx overlaps several tens to several hundreds of pixels PX.

The switch circuit group SWG connected to the common lines CML is disposed outside the driver chip DRC, though explained later in detail. The switch circuit group SWG is disposed in the non-display area NDA on the first substrate SUB1. A control pulse generator CPG is connected to the switch circuit group SWG.

The control pulse generator CPG is a circuit which selectively turns on and off switches (explained later in detail) provided in the switch circuit group SWG. The control pulse generator CPG is disposed outside the driver chip DRC, for example, in the non-display area NDA on the first substrate SUB1. If the control pulse generator CPG is disposed outside the driver chip DRC, versatility of the driver chip DRC is increased. The control pulse generator CPG may be disposed inside the driver chip DRC. Details of the layout of the switch circuit group SWG connecting each of the detection electrodes Rx to the sensor SE will be explained later in detail with reference to FIG. 13 and the like. The control pulse generator CPG may be disposed inside the driver chip DRC.

The arrangement of the scanning line driver GD (FIG. 2) and the common electrode driver CD (FIG. 4) is not limited to the examples shown in FIG. 2 and FIG. 4. For example, either or both of the scanning line driver GD and the common electrode driver CD may be disposed in the driver chip DRC. The common electrode driver CD may be disposed on the first substrate SUB1 shown in FIG. 2. The common electrode driver CD may be disposed in the non-display area NDA. The common electrode driver CD may be disposed outside the display panel PNL and connected to the display panel PNL via the flexible printed circuit FPC1.

As shown in FIG. 5, each of the pixels PX includes the pixel switch PSW and the pixel electrode PE. The pixels PX may share one common electrode CE. The pixel switch PSW includes, for example, a thin-film transistor (TFT). The pixel switch PSW is electrically connected to the scanning line GL and the signal line SL. A semiconductor layer of the pixel switch PSW is formed of, for example, polycrystalline silicon (poly-silicon) but may be formed of amorphous silicon.

The pixel electrode PE is electrically connected to the pixel switch PSW. The pixel electrode PE is opposed to the common electrode CE via the insulating film. The liquid crystal layer LQ is disposed between the pixel electrode PE and the common electrode CE. A storage capacitor CS is formed by the common electrode CE, an insulating film and the pixel electrode PE.

An electric field is formed between the pixel electrode PE and the common electrode CE, based on the drive signal applied to each electrode, during the display period (shown in FIG. 15) in which a display image is formed based on the video signals. Liquid crystal molecules contained in the liquid crystal layer LQ serving as the electro-optical layer are driven by the electric field formed between the pixel electrode PE and the common electrode CE. In the display device using the lateral electric field mode, the pixel electrodes PE and the common electrodes CE are disposed on the first substrate SUB1 as shown in FIG. 3. The liquid crystal molecules contained in the liquid crystal layer LQ are rotated by using the electric field formed between the pixel electrode PE and the common electrode CE (for example, the electric field approximately parallel to the main surface of the substrate, of the fringe field).

During the display period, each of the pixel electrode PE and the common electrode CE operates as the drive electrode which drives the liquid crystal layer LQ serving as the electro-optical layer. The pixel electrode PE is also called a first drive electrode which drives the electro-optical layer. The common electrode CE is also called a second drive electrode which drives the electro-optical layer. As explained above, since the common electrode CE serves as the detection electrode Rx for the self-capacitive touch detection, the detection electrode Rx is also called the second drive electrode which drives the electro-optical layer. In the following explanations, the detection electrode Rx is synonymous with the common electrodes CE or the drive electrode which drives the electro-optical layer unless explained especially.

As shown in FIG. 3, the first substrate SUB1 and the second substrate SUB2 are bonded to each other while spaced apart in a certain distance. The liquid crystal layer LQ is sealed between the first substrate SUB1 and the second substrate SUB2. The first substrate SUB1 includes the insulating substrate 10 having a light transmitting property, such as a glass substrate or a resin substrate. The first substrate SUB1 includes conductive patterns on the side of the insulating substrate 10 which is opposed to the second substrate SUB2. The conductor patterns include the scanning lines GL, the signal lines SL, common lines CML, the common electrodes CE, and the pixel electrodes PE. The insulating films are intervened between the conductor patterns. The insulating films disposed between the adjacent conductor patterns to insulate the conductor patterns from each other include the insulating films 11, 12, 13, 14, and the alignment film AL1. One scanning line GL, one common electrode CE, and one common line CML are shown in FIG. 3.

The above-explained conductor patterns are formed on deposited wiring layers, respectively. The common electrode CE and the pixel electrodes PE are formed in different layers. Three wiring layers WL1, WL2, and WL3 are disposed under the layer in which the common electrode CE is formed. The scanning line GL is mainly formed in the first wiring layer WL1 provided on the side closest to the insulating film 10, of three wiring layers formed on the insulating substrate 10. The conductor pattern formed in the wiring layer WL1 is composed of, for example, a metal such as chromium (Cr), titanium (Ti) or molybdenum (Mo) or their alloys.

The insulating film 11 is formed on the wiring layer WL1 and the insulating substrate 10. The insulating film 11 includes a transparent insulating film formed of, for example, silicon nitride or silicon oxide. The scanning line GL, the gate electrode of the pixel switch, the semiconductor layer, and the like are disposed between the insulating substrate 10 and the insulating substrate 11.

The second wiring layer WL2 is formed on the insulating film 11. The signal line SL is mainly formed in the wiring layer WL2. The conductor pattern formed in the wiring layer WL2 includes, for example, a metal film of a multi-layer structure formed by sandwiching aluminum (Al) between molybdenum (Mo), titanium (Ti) and the like. The material of the wiring layer WL2 may be lower in specific resistivity than the material of the wiring layer WL1. Source electrodes, drain electrodes and the like of the pixel switches are also formed on the insulating film 11. The insulating film 12 is disposed on each of the signal lines SL and the insulating film 11. The signal lines SL extend in the X direction. The insulating film 12 includes, for example, acrylic photosensitive resin.

The third layer, i.e., the third wiring layer WL3 is formed on the insulating film 12. The common line CML is mainly formed in the wiring layer WL3. The conductor pattern formed in the wiring layer WL3 includes, for example, a metal film of a multi-layer structure formed by sandwiching aluminum (Al) between molybdenum (Mo), titanium (Ti) and the like, similarly to the wiring layer WL2. The common line CML extends in the Y direction. The insulating film 13 is formed on each of the common line CML and the insulating film 12. The insulating film 13 is formed of, for example, acrylic photosensitive resin.

The common electrodes CE are formed on the insulating film 13. The common electrodes CE serve as the detection electrodes Rx for touch detection. The common electrodes CE may be formed of a transparent conductive material such as indium tin oxide (ITO) or indium zinc oxide (IZO). If the display device is a display device of the longitudinal electric field mode (for example, TN mode or VA mode), the common electrodes CE may be formed on the second substrate SUB2. The insulating film 13 is intervened between the common electrodes CE and the common lines CML. As shown in FIG. 4, however, parts of the common lines CML and parts of the common electrodes CE are electrically connected to each other. If the display device is a reflective display device using reflection of external light, the common electrodes CE may be formed of a metal material.

The insulating film 14 is formed on the common electrodes CE. The pixel electrodes PE are formed on the insulating film 14. Each of the pixel electrodes PE is disposed between two adjacent signal lines SL and opposed to the common electrode CE. The pixel electrode PE is formed of, for example, a transparent conductive material or metal material such as ITO or IZO. The alignment film AL1 covers the pixel electrodes PE and the insulating film 14.

The second substrate SUB2 includes the insulating substrate 20 having a light transmitting property, such as a glass substrate or a resin substrate. The second substrate SUB2 includes the black matrix BM which is a light-shielding layer, color filters CFR, CFG, and CFB, overcoat layer OCL, alignment film AL2, and conductive film CDF, on a side of the insulating substrate 20 which is opposed to the first substrate SUB1.

The black matrix BM is a light-shielding area formed on a surface of the insulating substrate 20 on the first substrate SUB1 side to partition each pixel. Each of the red, green, and blue color filters CFR, CFG, and CFB is formed on the surface of the insulating substrate 20 on the first substrate SUB1 side. When the display surface of the display panel PNL is seen from a direction perpendicular to the surface, each of the color filters CFR, CFG, and CFB partially overlaps the black matrix BM. The red color filter CFR is a color filter which allows light of a wavelength of a red component to be transmitted, the green color filter CFG is a color filter which allows light of a wavelength of a green component to be transmitted, and the blue color filter CFB is a color filter which allows light of a wavelength of a blue component to be transmitted. The overcoat layer OCL covers the color filters CFR, CFG, and CFB. The overcoat layer OCL is formed of a transparent resin material. The alignment film AL2 covers the overcoat layer OCL.

The common electrodes CE are formed of a transparent material such as ITO but its resistance value is high. To lower the resistance value of the common electrodes CE, a metal line 3M called a third metal line is provided in an area shielded from light by the black matrix BM of the wiring layer WL3.

The conductive film CDF is disposed on a plane of the side opposite to the surface opposed to the liquid crystal layer LQ, of planes of the insulating substrate 20. The conductive film CDF is formed of, for example, a transparent conductive material such as ITO or IZO. The conductive film CDF functions as a shield layer for suppressing an influence of electromagnetic waves from the outside to the liquid crystal layer LQ and the like. If the mode of driving the liquid crystal layer LQ is the longitudinal electric field mode such as TN mode or VA mode, the electrodes are provided on the second substrate SUB2 and also function as shield layers, and arrangement of the conductive film CDF can be omitted. If the touch detection is executed in the mutual-capacitive mode, the conductive films CDF subjected to patterning are formed on the insulating substrate 20. The conductive films CDF may be used as the detection electrodes for touch detection.

The display panel PNL includes optical elements OD1 and OD2. The optical element OD1 is interposed between the insulating substrate 10 and the backlight unit BL. The optical element OD2 is disposed above the insulating substrate 20, i.e., the insulating substrate 20 is arranged between the optical element OD2 and the first substrate SUB1. Each of the optical element OD1 and the optical element OD2 includes at least a polarizer and may include a phase difference film as needed.

[Touch Detection]

A method of detecting a position of an input object such as a finger or a stylus, i.e., an input position by the display panel PNL using the detection electrodes Rx will be explained. The display panel PNL can determine the input position information, based on the variation in the electrostatic capacitance detected by the detection electrodes Rx in the self-capacitive sensing mode. A finger touching or approaching the touch detection surface TDS (FIG. 3) of the display panel PNL can be thereby detected. The touch detection surface TDS is one of surfaces of the optical element OD2, on a side opposite to the second substrate SUB2.

A principle and a method of the touch detection in the self-capacitive sensing mode will be hereinafter explained. However, the display panel PNL may determine the input position information, based on the variation in the electrostatic capacitance detected by the detection electrodes Rx in the mutual-capacitive mode. The detection in the self-capacitive sensing mode and the detection in the mutual-capacitive mode may be executed alternately. If the display device includes detection electrodes in the self-capacitive sensing mode and detection electrodes in the mutual-capacitive mode independently, the self-capacitive sensing mode and the mutual-capacitive mode may be executed simultaneously. The touch detection in the self-capacitive sensing mode is executed based on the variation in signals output from the detection electrodes Rx, by inputting the drive signals to the detection electrodes Rx.

A principle of a touch detection method in the self-capacitive sensing mode will be explained. The self-capacitive sensing mode uses capacitance Cx1 which the detection electrodes Rx have and capacitance Cx2 generated by a finger or the like of the user who touches the detection electrodes Rx. FIG. 6 to FIG. 9 are explanatory views schematically showing a circuit operation of the touch detection in the self-capacitive sensing mode.

Figure 7:
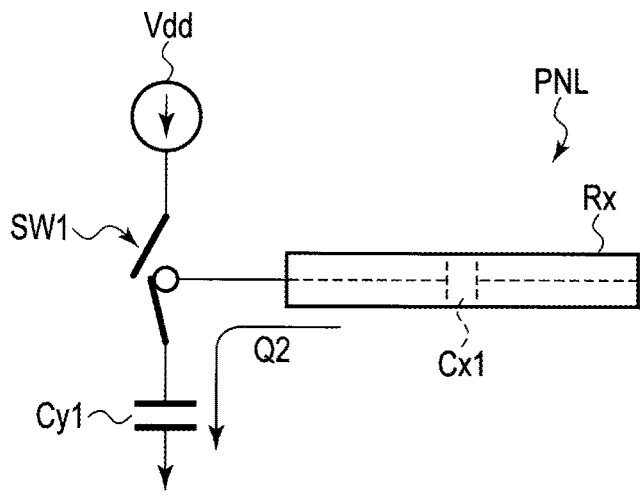
FIG. 7 is a circuit diagram showing an example of the self-capacitive touch detection.

FIG. 6 and FIG. 7 show a state in which the user's finger does not touch the touch detection surface of the display panel PNL. In this state, electrostatic capacitive coupling does not occur between the detection electrode Rx and the finger. FIG. 6 shows a state in which the detection electrode Rx is connected to power source Vdd by a switch SW1. FIG. 7 shows a state in which the detection electrode Rx is disconnected from the power source Vdd and connected to capacitance Cy1 serving as a capacitor by the switch SW1.

In the state shown in FIG. 6, electric charges Q1 flow from the power source Vdd to capacitance Cx1, and the capacitance Cx1 is charged. In the state shown in FIG. 7, electric charges Q2 flow from the capacitance Cx1 to the capacitance Cy1, and the capacitance Cx1 is discharged. Charging the capacitance Cx1 indicates writing the write signal to the detection electrode Rx. Discharging the capacitance Cx1 indicates reading the read signal indicating the variation in the electrostatic capacitance which has occurred in the detection electrode Rx.

Figure 8:
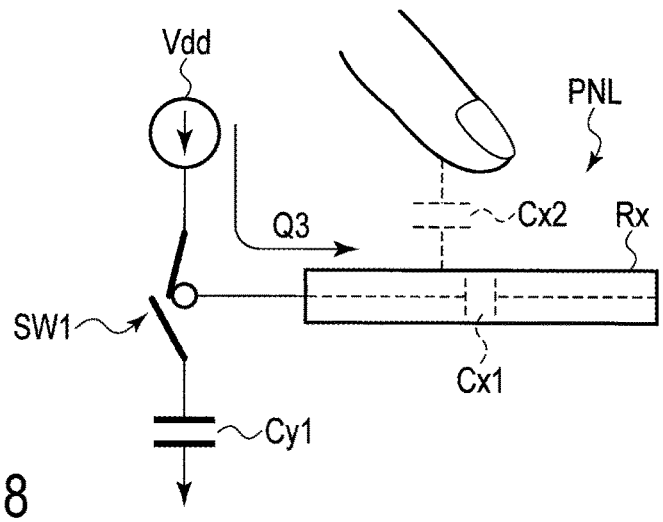
FIG. 8 is a circuit diagram showing an example of the self-capacitive touch detection.
Figure 9:
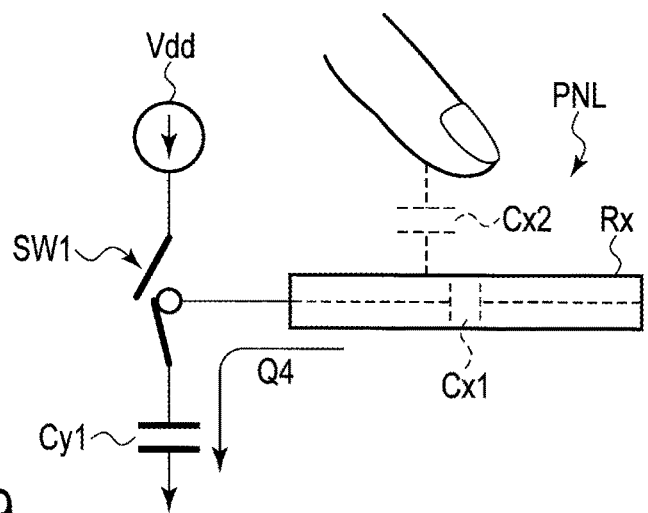
FIG. 9 is a circuit diagram showing an example of the self-capacitive touch detection.

FIG. 8 and FIG. 9 show a state in which the user's finger touches the touch detection surface TDS of the display panel PNL. In this state, electrostatic capacitive coupling occurs between the detection electrode Rx and the finger. FIG. 8 shows a state in which the detection electrode Rx is connected to the power source Vdd by the switch SW1. FIG. 9 shows a state in which the detection electrode Rx is disconnected from the power source Vdd and connected to the capacitance Cy1 by the switch SW1.

In the state shown in FIG. 8, electric charges Q3 flow from the power source Vdd to the capacitance Cx1, and the capacitance Cx1 is charged. In the state shown in FIG. 9, electric charges Q4 flow from the capacitance Cx1 to the capacitance Cy1, and the capacitance Cx1 is discharged.

Time dependence of the voltage charged to the capacitance Cy1 at the discharge of the capacitance Cx1 shown in FIG. 7 is different from the time dependence of the voltage charged to the capacitance Cy1 at the discharge of the capacitance Cx1 shown in FIG. 9 since capacitance Cx2 exists in the state shown in FIG. 9. Therefore, in the self-capacitive sensing mode, the input position information (for example, operation input) is determined by using the feature that the time dependence of the voltage of the capacitance Cy1 is varied in accordance with the capacitance Cx2.

Figure 10:
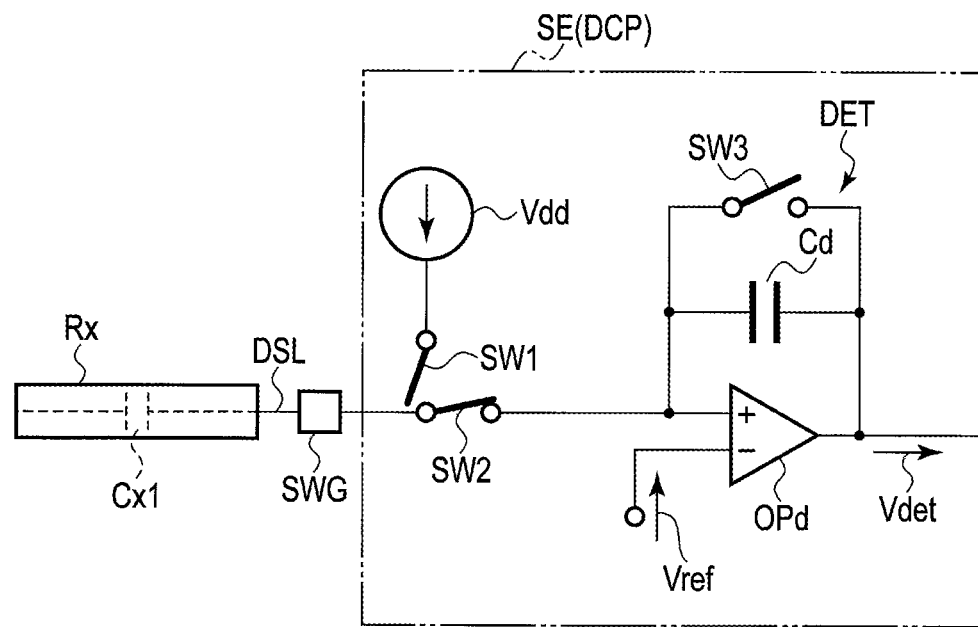
FIG. 10 is a circuit diagram showing an example of the self-capacitive touch detection.
Figure 11:
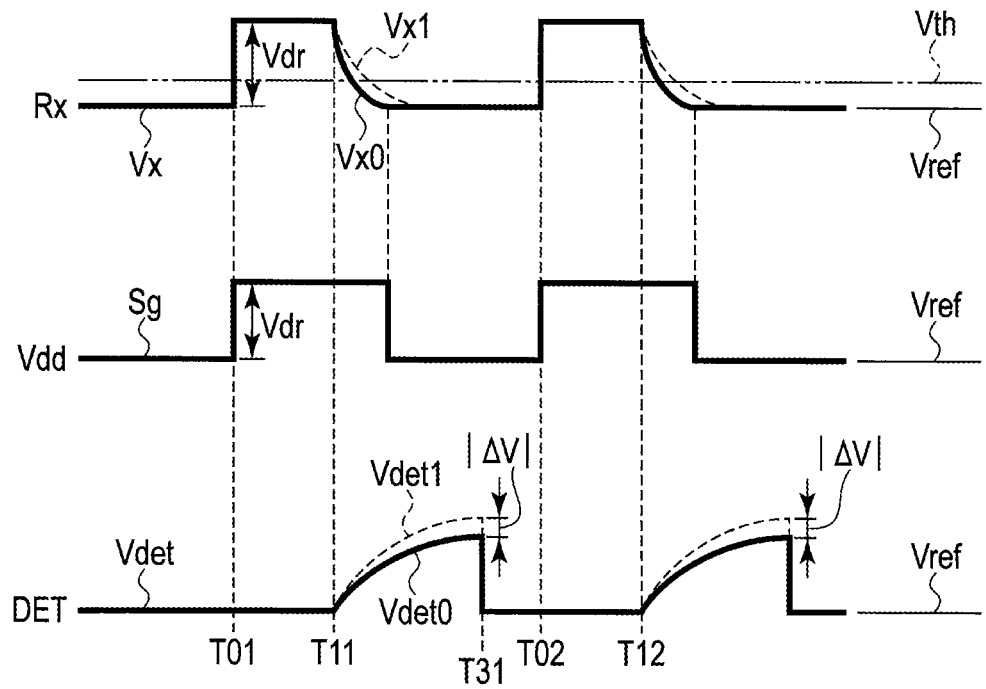
FIG. 11 is a signal waveform chart showing an example of the self-capacitive touch detection.

An example of a circuit which implements the self-capacitive sensing mode will be explained. FIG. 10 shows an example of a circuit implementing the self-capacitive sensing mode. FIG. 11 shows examples of time dependence of the voltage of the detection electrode Rx, an alternating square wave output from the power source Vdd, and the voltage which is an output of a detector DET. In FIG. 10, the capacitance of the detection electrode Rx is called the capacitance Cx1. The switch circuit group SWG shown in FIG. 4 is connected in the middle of a detection signal line DSL between the sensor SE (DCP) and the detection electrode Rx.

As shown in FIG. 10, electric connection of the detection electrode Rx to the power source Vdd is turned on and off by turning on and off the switch SW1. Electric connection of the detection electrode Rx to the detector DET (for example, a voltage detector) is turned on and off by turning on and off a switch SW2. The detector DET is an integrator circuit, which includes, for example, an operational amplifier OPd, a capacitance Cd, and a switch SW3. A non-inverting input terminal of the operational amplifier OPd is connected to the detection electrode Rx via the switch SW2. A reference signal Vref is input to an inverting input terminal of the operational amplifier OPd.

As shown in FIG. 11, the power source Vdd outputs an alternating square wave Sg having a wave height of a voltage Vdr by setting a time difference between time T01 and time T02 as a cycle. The alternating square wave Sg has, for example, a frequency from several kHz to several hundreds of kHz. The detector DET converts the variation in the current according to the alternating square wave Sg into variation in voltage (i.e., waveform Vdet0 or waveform Vdet1). The waveform Vdet0 and waveform Vdet1 are generically called waveforms Vdet.

As explained with reference to FIG. 10, electric connection of the detection electrode Rx to the power source Vdd and the detector DET can be changed by turning on and off the switch SW1 and the switch SW2. In FIG. 11, the alternating square wave Sg rises by voltage Vdr at time T01. At time T01, the switch SW1 is turned on while the switch SW2 is turned off. For this reason, voltage Vx of the detection electrode Rx also rises by the voltage Vdr at time T01. The switch SW1 is turned off before time T11. At this time, if both of the switch SW1 and the switch SW2 are turned off, the detection electrode Rx is in a state of floating electrically, i.e., a floating state. However, the voltage Vx of the detection electrode Rx is a voltage at which rise of the voltage Vdr is maintained, by the capacitance Cx1 (FIG. 6) of the detection electrode Rx or capacitance Cx1+Cx2 obtained by adding the capacitance Cx2 (FIG. 8) added by touch of a finger or the like to the capacitance Cx1 of the detection electrode Rx. Furthermore, the switch SW3 is turned on before time T11 and then the switch SW3 is turned off before time T11. Voltage Vdet which is the output of the detector DET is reset by this operation. After executing the reset operation, the voltage Vdet of the detector DET becomes approximately equal to the voltage of the reference signal Vref.

Then the switch SW2 is turned on at time T11. The voltage input to the non-inverting input terminal of the detector DET becomes equal to the voltage Vx of the detection electrode Rx. After that, the voltage of an inverting input terminal of the detector DET is lowered to a value approximately equal to the reference signal Vref at a response speed according to a time constant resulting from the capacitance Cx1 of the detection electrode Rx (or the above capacitances Cx1+Cx2) and the capacitance Cd included in the detector DET. Since the electric charges stored in the capacitance Cx1 of the detection electrode Rx (or the capacitances Cx1+Cx2) move to the capacitance Cd included in the detector DET, the voltage Vdet of the detector DET rises. The voltage Vdet becomes a voltage having waveform Vdet0 represented by a solid line when an object such as a finger does not touch the detection electrode Rx. Vdet0=Cx1×Vdr/Cd. The voltage Vdet becomes a voltage having waveform Vdet1 represented by a broken line when an object such as a finger touches and the capacitance generated by an influence of the object is added. Vdet1= (Cx1+Cx2)×Vdr/Cd Then, the switch SW2 is turned off while the switch SW1 and the switch SW3 are turned on at time T31 after the electric charges of the capacitance Cx1 of the detection electrode Rx (or the capacitances Cx1+Cx2) have sufficiently moved to the capacitance Cd. By this operation, the voltage of the detection electrode Rx becomes equal to a low level of the alternating square wave Sg, i.e., a relatively lower voltage level of the square wave. The voltage which is the output from the detector DET is reset by the reset operation of turning off the switch SW2 and turning on the switch SW3. The switch SW1 may be turned on at any timing before time T02 after turning off the switch SW2. In addition, the detector DET may be reset at any timing before time T12 after turning off the switch SW2.

In a period of executing the touch detection, the operations explained with reference to FIG. 6 to FIG. 11 are repeated in a predetermined frequency (for example, approximately, several kHz to several hundreds of kHz) for each of the detection electrodes Rx shown in FIG. 4. Presence of the object (touch) which has touched the touch detection surface from the outside can be measured, based on absolute value |ΔV| of a difference between the waveform Vdet0 and the waveform Vdet1.

The operation principles of the self-capacitive sensing mode and the typical example of the circuit implementing the self-capacitive sensing mode have been explained above. However, the method of implementing the self-capacitive sensing mode can be variously modified. For example, touch detection of the following modified example may be executed instead of the self-capacitive touch detection or in addition to the above-explained self capacitive touch detection. If the object such as a finger does not touch the touch detection surface, the waveform of the voltage Vx of the detection electrode Rx becomes voltage Vx0 represented by a solid line of FIG. 11. When the object such as a finger touches the touch detection surface and the capacitance Cx2 resulting from an influence of the object is added, the waveform of the voltage Vx of the detection electrode Rx becomes a voltage having waveform Vx1 represented by a broken line of FIG. 11. For this reason, if periods of time in which the waveform Vx0 and the waveform Vx1 lower to a threshold voltage Vth exemplified by a two-dot-chained line in FIG. 11 are measured and compared, presence of the object (touch) which has touched the touch detection surface from the outside can be determined.

[CDM Drive]

The embodiments may employ a code division multiplexing (CDM) drive method, as the method of driving the detection electrode for touch detection. The CDM drive method is capable of executing the touch detection in a short time by enhancing the detection sensitivity and improving the touch detection accuracy. In the CDM drive, a predetermined number of detection electrodes in each row or each column are classified into groups, the detection electrodes are simultaneously driven and detected in the group, and simultaneous drive is executed several times while changing combination of the simultaneously driven detection electrodes. By operating the signals obtained by the simultaneous drive, an amplified value of the detected value of each detection signal can be obtained.

FIG. 12 shows an operation of the switch circuit group SWG for CDM drive (schematically shown in FIG. 4). Ends of drive signal lines TSpL1, TSpL2, . . . of the respective rows are connected to the touch sensing chip TSC (sensor SE), and the other ends of the drive signal lines TSpL1, TSpL2, . . . of the respective rows are connected to first input ends of the switch circuits SW of the respective rows. The switch circuits SW are connected to the detection elements Rx of the respective rows. An end of a guard signal line TSnL common to all of the detection electrodes Rx is connected to the touch sensing chip TSC (sensor SE), and the other end of the guard signal line TSnL is connected to second input ends of all the switch circuits SW connected to all the detection elements Rx. A common potential supply line VDCL has an end connected to the common electrode driver CD and the other end connected to third input ends of all the switch circuits SW connected to all the detection electrodes Rx. The switch circuits SW in each column are controlled by drive signals from the control pulse generator CPG In FIG. 12, each switch circuit SW is illustrated under the detection element Rx of each row for convenience of explanation but, in fact, all the switch circuits SW are provided under the entire array of the detection elements Rx, in the non-display area NDA, as the switch circuit group SWG. Each of the drive signal lines TSpL1, TSpL2, . . . corresponds to the detection signal line DSL shown in FIG. 10.

The drive signals are supplied via the drive signal lines TSpL1, TSpL2, . . . to the detection electrodes Rx selected in accordance with selection of the switch circuits SW. If the drive signals are supplied to several detection electrodes, in the array of the detection electrodes Rx, a potential difference may occur between detection electrodes which are supplied with the drive signals and detection electrodes which are not supplied with the drive signals, and parasitic capacitance may be thereby generated. In the embodiments, signals having the same waveform as the drive signals are supplied to unselected detection electrodes which are not supplied with the drive signals. Thereby, generation of the parasitic capacitance is suppressed. The signals having the same waveform as the drive signals input to the unselected detection electrodes are called guard signals. The guard signals are common to all the detection electrodes.

In the display period, the switch circuits SW are controlled to supply to all the detection electrodes Rx a constant DC voltage supplied from the common electrode driver CD via the common potential supply line VDCL. In the touch detection period, the switch circuits SW are controlled to supply to the selected detection electrodes the drive signals supplied from the sensor SE via the drive signal lines TSpL1, TSpL2, . . . , and to supply to the unselected detection electrodes the guard signals supplied from the sensor SE via the guard signal line TSnL.

Figure 13:
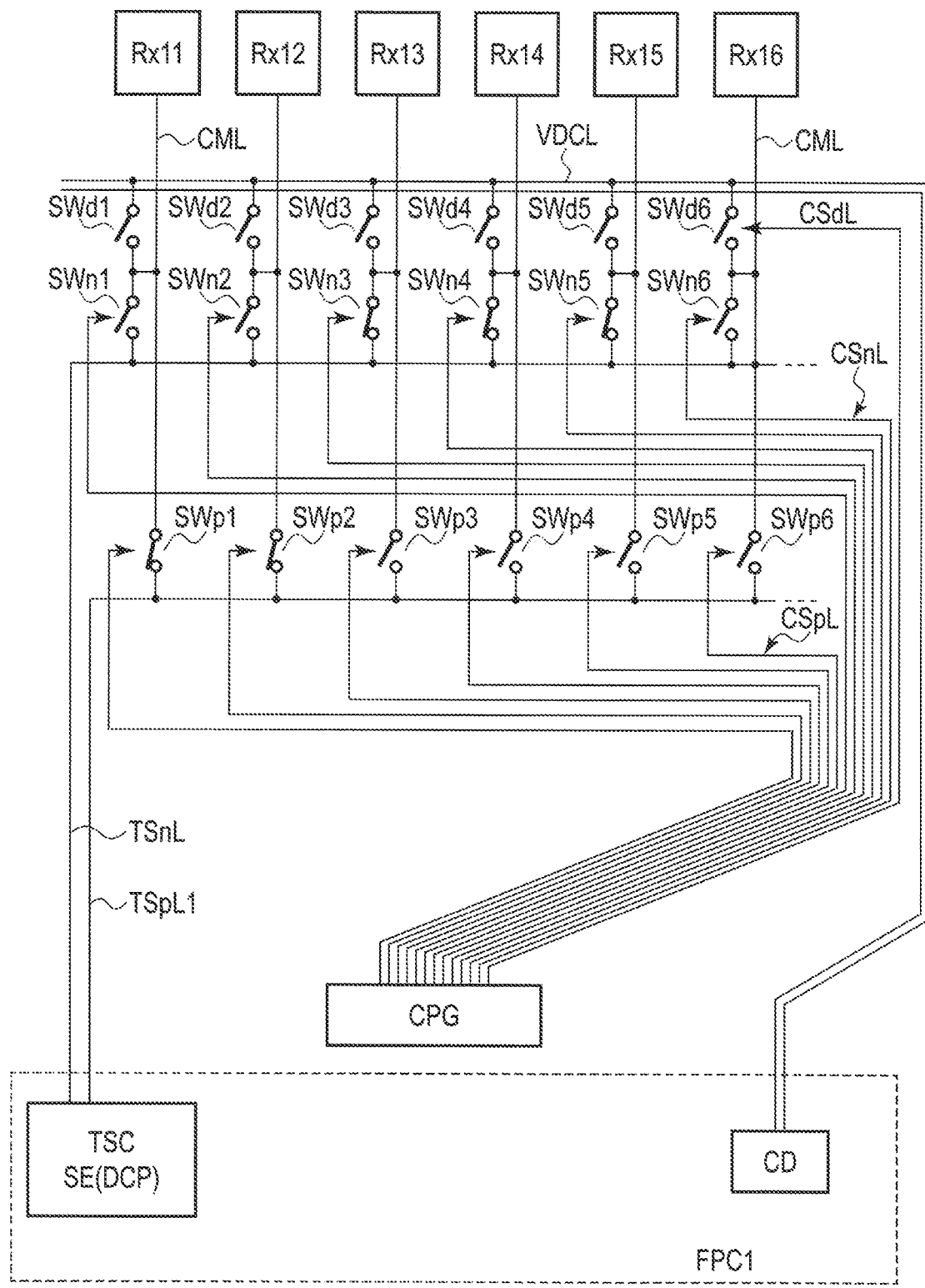
FIG. 13 is a circuit diagram showing details of an example of the switch circuit group SWG.

FIG. 13 is a circuit diagram showing the switch circuits SW of one row in the switch circuit group SWG shown in FIG. 4. The detection element array is assumed to include the detection elements of six columns for convenience of explanations. The switch circuit SW of each column j is composed of three switches SWdj, SWpj, and SWnj. The switches are illustrated as on/off switches but are formed of TFTs for convenience of explanations.

A first terminal of the switch SWdj is connected to the common potential supply line VDCL. A first terminal of the switch SWpj is connected to the drive signal line TSpL1. A first terminal of the switch SWnj is connected to the guard signal line TSnL. Second terminals of the switches SWdj, SWpj, and SWnj are connected commonly and common connections are connected to the detection electrodes Rxj via the common lines CML.

The switches SWdj of all the columns are turned off in the touch detection period and turned on in the display period, by the control signals supplied from the control pulse generator CPG via the control signal line CSdL. As a result, the common potential is supplied from the common potential supply line VDCL to the detection electrodes Rx in the display period. The switches SWpj and SWnj are driven complementarily for each column by the control signals supplied from the control pulse generator CPG via the control signal lines CSpL and CSnL (one of the switches is turned on when the other is turned off). The switches SWpj and SWnj are turned off in the display period, and sequentially turned on for each column in the touch detection period. As a result, the drive signals or the guard signals are supplied to the detection electrodes Rx in the touch detection period. The detection electrodes of the other rows are also connected to the switch circuits SW of each row similarly to FIG. 13, and the switch circuits SW of each row are connected to the sensor SE for each row.

The principle of CDM will be explained with reference to FIG. 14. Driving the detection electrodes Rx of four rows and six columns by "CDM3" will be explained for convenience of explanations. "CDM3" is a driving method of executing simultaneous drive of two detection electrodes three times while recognizing three detection electrodes as one group. Each drive is called scan. Driving one group is completed by three scans. In the CDM drive, the detection electrodes of the same column of all rows are driven simultaneously. Driving the detection electrodes one after another is also called "CDM1".

In the first scan (scan 1), the detection electrodes Rx11 to Rx41 and Rx12 to Rx42 of the first and second columns are connected to the drive signal lines TSpL1 to TSpL4, and the other detection electrodes are connected to the guard signal line TSnL. For this reason, in the first scan, the sensor SE detects, for each row i, a total of detection values of the detection electrodes Rxi1 and Rxi2 of the first and second columns. In the second scan (scan 2), the detection electrodes Rx12 to Rx42 and Rx13 to Rx43 of the second and third columns are connected to the drive signal lines TSpL1 to TSpL4, and the other detection electrodes are connected to the guard signal line TSnL. For this reason, in the second scan, the sensor SE detects, for each row i, a total of detection values of the detection electrodes Rxi2 and Rxi3 of the second and third columns. In the third scan (scan 3), the detection electrodes Rx11 to Rx41 and Rx13 to Rx43 of the first and third columns are connected to the drive signal lines TSpL1 to TSpL4, and the other detection electrodes are connected to the guard signal line TSnL. For this reason, in the third scan, the sensor SE detects, for each row i, a total of detection values of the detection electrodes Rxi1 and Rxi3 of the first and third columns. The detection electrodes of each of the first, second, and third rows are driven two times in three scans.

Next, scan of the detection electrodes of the fourth to sixth columns is executed similarly to scan of the detection electrodes of the first to third columns. In the fourth scan (scan 4), the detection electrodes Rx14 to Rx44 and Rx15 to Rx45 of the fourth and fifth columns are connected to the drive signal lines TSpL1 to TSpL4, and the other detection electrodes are connected to the guard signal line TSnL. For this reason, in the fourth scan, the sensor SE detects, for each row i, a total of detection values of the detection electrodes Rxi4 and Rxi5 of the fourth and fifth columns. In the fifth scan (scan 5), the detection electrodes Rx15 to Rx45 and Rx16 to Rx46 of the fifth and sixth columns are connected to the drive signal lines TSpL1 to TSpL4, and the other detection electrodes are connected to the guard signal line TSnL. For this reason, in the fifth scan (scan 5), the sensor SE detects, for each row i, a total of detection values of the detection electrodes Rxi5 and Rxi6 of the fifth and sixth columns. In the sixth scan (scan 6), the detection electrodes Rx14 to Rx44 and Rx16 to Rx46 of the fourth and sixth columns are connected to the drive signal lines TSpL1 to TSpL4, and the other detection electrodes are connected to the guard signal line TSnL. For this reason, in the sixth scan, the sensor SE detects, for each row i, a total of detection values of the detection electrodes Rxi4 and Rxi6 of the fourth and sixth columns. The detection electrodes of each of the fourth, fifth, and sixth rows are driven two times in three scans. If the detection electrodes Rx of the seventh or more columns are disposed, scan of the detection electrodes of three columns is executed similarly to scan of the detection electrodes of the first to third columns.

Figure 14:
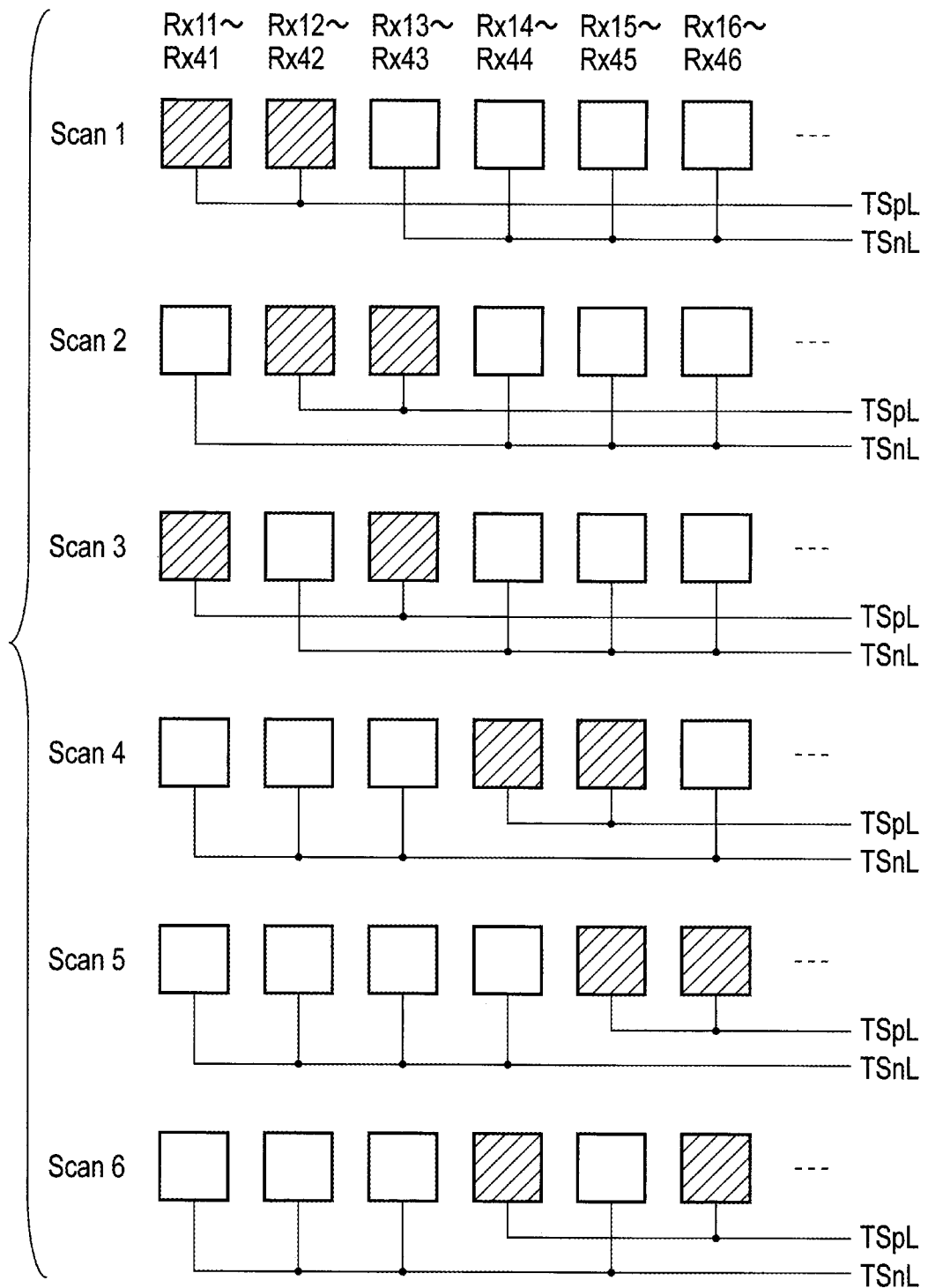
FIG. 14 is a circuit diagram showing a principle of an example of the CDM drive.
Figure 15:
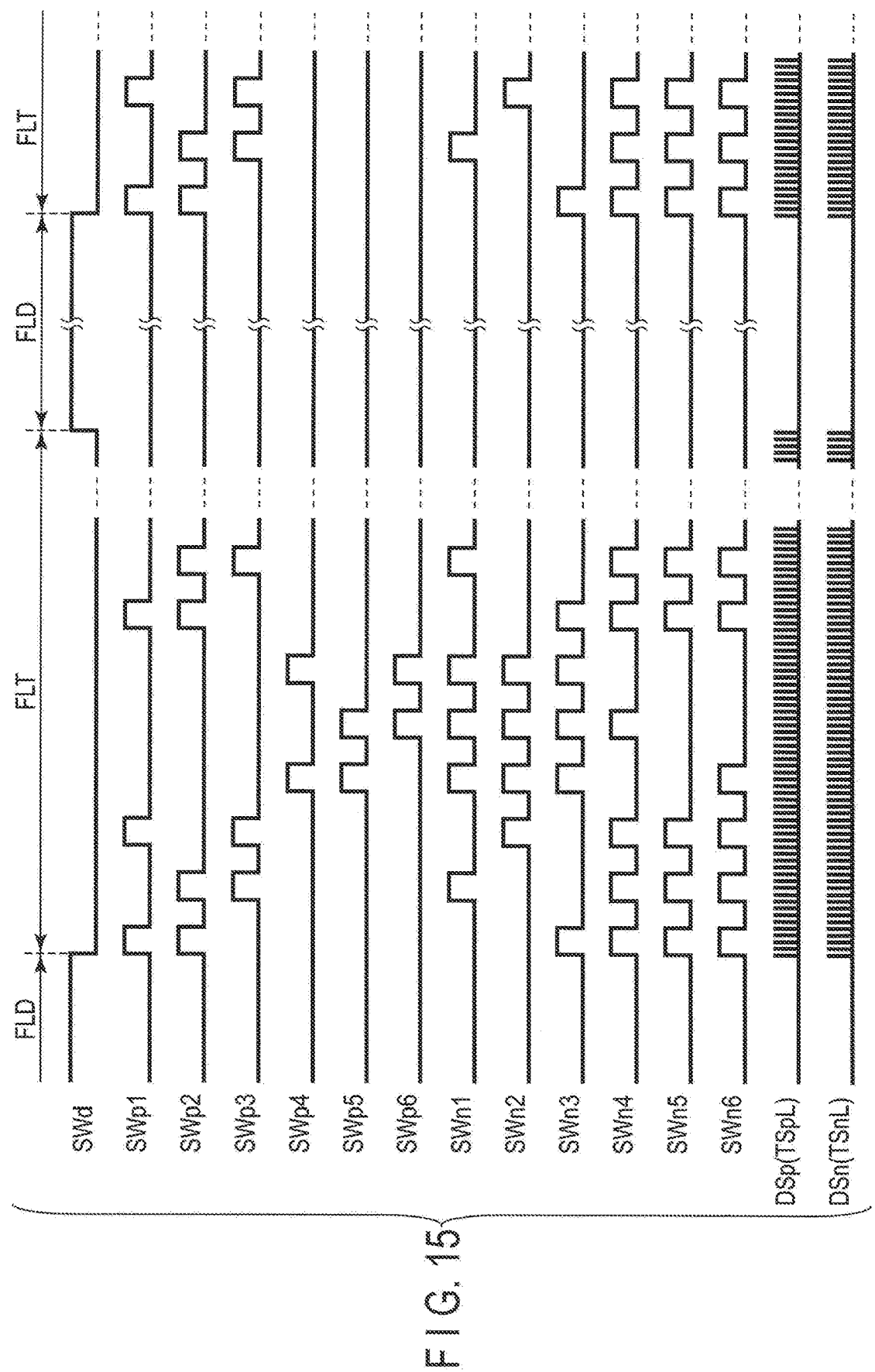
FIG. 15 is a signal waveform chart showing an example of the CDM drive.

FIG. 15 is a timing chart showing turning on/off the switches for explanation of the "CDM3" shown in FIG. 14. In the figure, the high level indicates turning on the switches while the low level indicates turning off the switches. In other words, FIG. 15 is also a timing chart showing control of the control pulse generator CPG which controls the switches. The display device of the embodiments has a display operation period FLD for executing a display operation of forming the image displayed on the display surface DS (see FIG. 3) and a touch detection operation period FLT for executing a touch detection operation of detecting touch of the object such as a finger on the touch detection surface TDS. The display operation period FLD is also called a display period. The touch detection operation period FLT is also called a detection period. The display operation FLD and the touch detection operation FLT are repeated. For this reason, the display periods FLD and the detection periods FLT are alternately repeated along the time axis (lateral direction) in the time chart shown in FIG. 15.

The switches SWd connected to the detection elements of all the rows and all the columns are turned off in the detection periods FLT and turned on in the display periods FLD. The switches SWp and SWn connected to the detection elements of all the rows and all the columns are turned off in the display periods FLD. For this reason, the common potential is supplied from the common potential supply line VDCL to all the detection electrodes Rx via the switches SWd in the display periods FLD. In the display periods FLD, the liquid crystal layer LQ (see FIG. 2) which is the electro-optical layer is driven based on the video signals and the display image is formed.

In the detection periods FLT, the switches SWp and SWn connected to the detection elements of each row are turned on in every two columns and the turned-on switches are sequentially changed as shown in FIG. 14. When the switches SWpj are turned on (or off), the switches SWnj are turned off (or on). If the detection electrodes Rx are arranged in six columns, the first scan is repeated after the sixth scan. The sensor SE outputs a drive signal DSp shaped in a high frequency pulse to the drive signal lines TSpL and a guard signal DSn having the same waveform as the drive signal to the guard signal line TSnL in the detection period FLT. For this reason, the drive signals DSp are supplied to the detection electrodes Rx of two columns selected by two turned-on switches SWp, and the guard signals DSn are supplied to the detection electrodes Rx of the other columns. The touch detection operation in the self-capacitive sensing mode explained with reference to FIG. 6 to FIG. 11 is thereby executed. The sensor SE detects a total of the detection values of the detection electrodes Rx of each row and two columns, via the drive signal lines TSpL serving as the detection signal lines DSL, and the detection value of each detection electrode Rx is obtained from the total detection value by the following operation.

In the touch detection period, driving the detection electrodes Rx of any two columns, of the detection electrodes Rx of three columns constituting one group of each row, by the drive signals DSp via the drive signal lines TSpL indicates that the drive signals DSp are coded by a code pattern (1 indicates the drive signal DSp and 0 indicates the guard signal DSn). The code pattern corresponds to turning on and off the switches SWp.

If the detection values of the detection electrodes Rx11, Rx12, and Rx13 are represented by s11, s12, and s13, total detection values Sc1, Sc2, and Sc3 of the detection electrodes Rx11, Rx12, and Rx13 detected by each scan are represented by Equation 1.

$$\begin{bmatrix} Sc1 \\ Sc2 \\ Sc3 \end{bmatrix} = \begin{bmatrix} 1 & 1 & 0 \\ 0 & 1 & 1 \\ 1 & 0 & 1 \end{bmatrix} \begin{bmatrix} s11 \\ s12 \\ s13 \end{bmatrix} \quad \text{(Eq. 1)}$$

Since the drive signal DSp is coded, values which are double the detection values s11, s12, and s13 of the respective detection electrodes can be obtained by operating an inverse matrix of the total detection values Sc1, Sc2, and Sc3 of the detection values of the detection electrodes Rx in the coding pattern of the drive signal DSp.

$$\begin{bmatrix} 1 & -1 & 1 \\ 1 & 1 & -1 \\ -1 & 1 & 1 \end{bmatrix} \begin{bmatrix} Sc1 \\ Sc2 \\ Sc3 \end{bmatrix} = \begin{bmatrix} 2 \times s11 \\ 2 \times s12 \\ 2 \times s13 \end{bmatrix} \quad \text{(Eq. 2)}$$

The detection value of each detection electrode Rx can be obtained from the total detection values of two detection electrodes Rx by executing operation of Equation 2 by the sensor SE, and the obtained detection value is double the actual detection value. Thus, the amplitude of the detection signal can be amplifies and the detection sensitivity can be increased.

It is assumed that, for example, the detection value of the touch portion is 1.2, the detection value of the non-touch portion is 1.0, and the detection electrode Rx12 is the touch portion. Since detection value s12 of the detection electrode Rx12 is 1.2 and detection values s11 and s13 of the other detection electrodes Rx11 and Rx13 are 1.0, total detection values Sc1, Sc2, and Sc3 of the respective first scan, second scan, and third scan are as follows.

$Sc1=1\times1.0+1\times1.2+0\times1.0=2.2$ $Sc2=0\times1.0+1\times1.2+0\times1.0=2.2$ $Sc3=1\times1.0+0\times1.2+1\times1.0=2.0$ If an inverse matrix of the code pattern is operated, the signals of the detectors Rx11, Rx12, and Rx13 are as follows.

$$\begin{aligned}
\text{Signal of Detector } Rx11 &= 1 \times Sc1 + (-1) \times Sc2 + 1 \times Sc3 \\
&= 2.2 - 2.2 + 2.0 \\
&= 2.0
\end{aligned}$$

$$\begin{aligned}
\text{Signal of Detector } Rx12 &= 1 \times Sc1 + 1 \times Sc2 + (-1) \times Sc3 \\
&= 2.2 + 2.2 - 2.0 \\
&= 2.4
\end{aligned}$$

$$\begin{aligned}
\text{Signal of Detector } Rx13 &= (-1) \times Sc1 + 1 \times Sc2 + 1 \times Sc3 \\
&= -2.2 + 2.2 + 2.0 \\
&= 2.0
\end{aligned}$$

Thus, the signals of the detectors Rx11, Rx12, and Rx13 become double the detection values. Since the signal of the detection electrode Rx12 is higher than the signals of the other detection electrodes, the detection electrode Rx12 can be determined as the touch electrode. After that, the detection values of the detection electrodes of three columns can be obtained by three scans in the similar manner.

If the touch is detected on a certain detection electrode Rx, coordinates of the position of the detection electrode Rx by which the touch has been detected on the touch detection surface (see FIG. 2) are calculated and the coordinate data are output to an external circuit such as the host device. The external circuit changes the image in the display area DA, based on the acquired coordinate data. Calculation of the position coordinates and output of the coordinate data may be executed by, for example, a circuit (for example, a data processing circuit) included in the sensor SE. The data processing circuit may be formed on the substrate SUB1 or formed in the driver chip DRC. The data processing circuit may be formed on the flexible printed circuit FPC1 or may be formed at a location remote from the display panel PNL and connected via the flexible printed circuit FPC1.

If the touch is not detected on any detection electrodes Rx, the coordinate data are not output to the external circuit. Alternatively, the above data processing circuit may output to the external circuit a signal indicating that the touch is not detected on any detection electrodes Rx.

Not only CDM3, but CDM4, CDM5, . . . and the like can be employed. For example, in CDM4, four detection electrodes are determined as one group and simultaneous drive of three detection electrodes is executed four times. If the detection value of each detection electrode Rx is obtained from the total detection values of three detection electrodes Rx, a value which is four times as large as the actual detection value can be obtained. In CDM9, simultaneous drive of five detection electrodes is executed nine times. The number of simultaneously driven electrodes and the number of times of simultaneous drive can be selected arbitrarily. The sensitivity is increased as the number of simultaneously driven electrodes is larger.

[Switch Circuit Group SWG]

Figure 16:
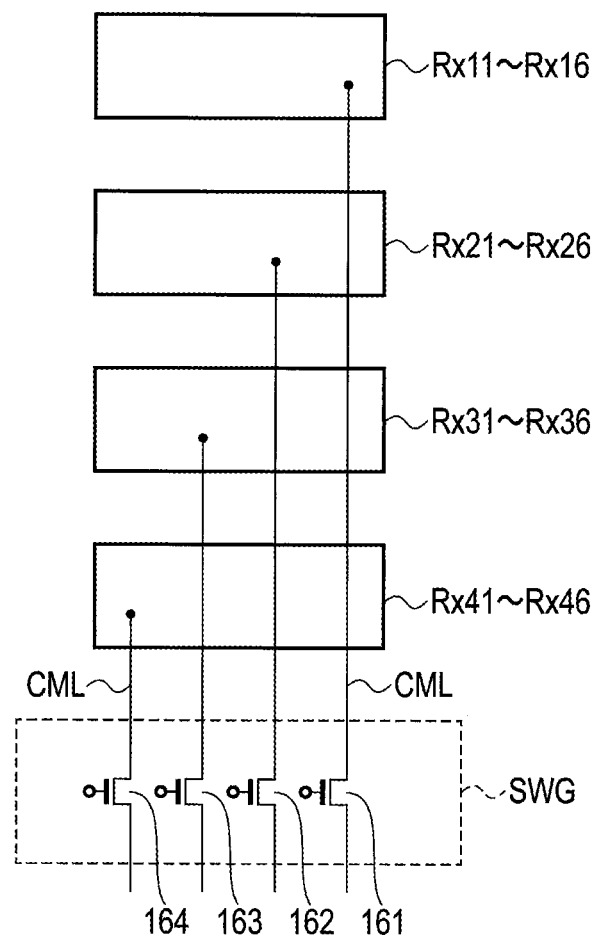
FIG. 16 is a circuit diagram showing an example of TFT of the switch circuit group SWG.
Figure 17A:
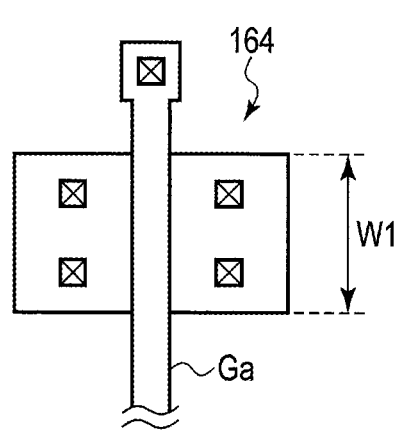
FIG. 17A is a circuit diagram showing a channel width of TFT of the switch circuit group SWG.
Figure 17B:
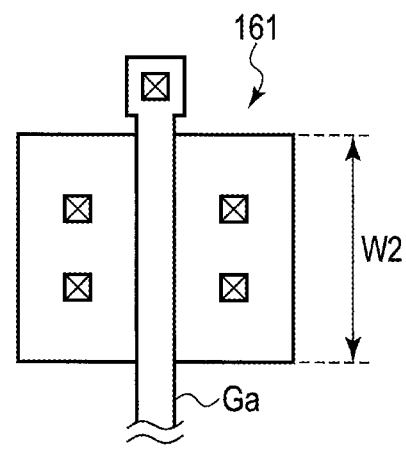
FIG. 17B is a circuit diagram showing a channel width of TFT of the switch circuit group SWG.

As shown in FIG. 4, the detection electrode Rx array is disposed in the display area DA, and the switch circuit group SWG is disposed in the non-display area NDA. For this reason, as shown in FIG. 16, the distance between the detection electrodes Rx of each row and the switch circuit group SWG is different in each row. The common line CML connecting the detection electrodes Rx remotest from the switch circuit group SWG, for example, the detection electrodes Rx11 to Rx16 of the first row to the switch circuit group SWG is the longest, and the common line CML connecting the detection electrodes Rx closest to the switch circuit group SWG, for example, the detection electrodes Rx41 to Rx46 of the fourth row to the switch circuit group SWG is the shortest. As the resistance of the common line is proportional to its length, the resistance between the switch circuit group SWG and the detection electrodes of each row is different in each row. For this reason, on-resistances of the TFTs constituting the switches SWd, SWp, and SWn included in the switch circuit group SWG do not need to be the same, but the on-resistance of the TFTs connected to the remote detection electrodes Rx11 to Rx16 via the longer CML line needs to be small while the on-resistance of the TFTs connected to the closer detection electrodes Rx41 to Rx46 via the shorter CML line may be large. The on-resistance of the TFT is inversely proportional to the channel width. For this reason, all the channel widths of TFTs 161, 162, 163, and 164 connected to the detection electrodes of the first to fourth rows do not need to be equal and may be different. The channel width of the TFT 161 connected to the detection electrodes Rx11 to Rx16 of the first row may be the largest, the channel widths of the TFT 162 and TFT 163 connected to the detection electrodes of the second and third rows may become smaller, and the channel width of the TFT 164 connected to the detection electrodes Rx41 to Rx46 of the fourth row may be the smallest. FIG. 17A shows an example of the TFT 164 connected to the detection electrodes of the fourth row. FIG. 17B shows an example of the TFT 161 connected to the detection electrodes of the first row. A channel width W1 of the TFT 164 along the gate line Ga is thus smaller than a channel width W2 of the TFT 161.

Thus, the channel width of the TFT connected to the detection electrode Rx which is the closest to the switch circuit group SWG, of the TFTs included in the switch circuit group SWG, can be made smaller than the channel widths of the other TFTs. For this reason, an occupation area of the TFTs is reduced, free space is increased on the first substrate SUB1, and mounting the circuits and layout of wirings are facilitated. If the degree of freedom of the wiring is increased and the density of wiring is reduced, the occurrence of the parasitic capacitance and the parasitic resistance can be suppressed.

[Wiring Example of Detection Electrodes Rx and Sensor SE]

As shown in FIG. 13, if the CDM drive is executed in the row direction, one drive signal line TSpL is connected to the detection electrodes Rx of all the columns of each row via the switches SWp. If the CDM drive is executed in the columnar direction, the connection shown in FIG. 18 and FIG. 20 can also be made.

Figure 19:
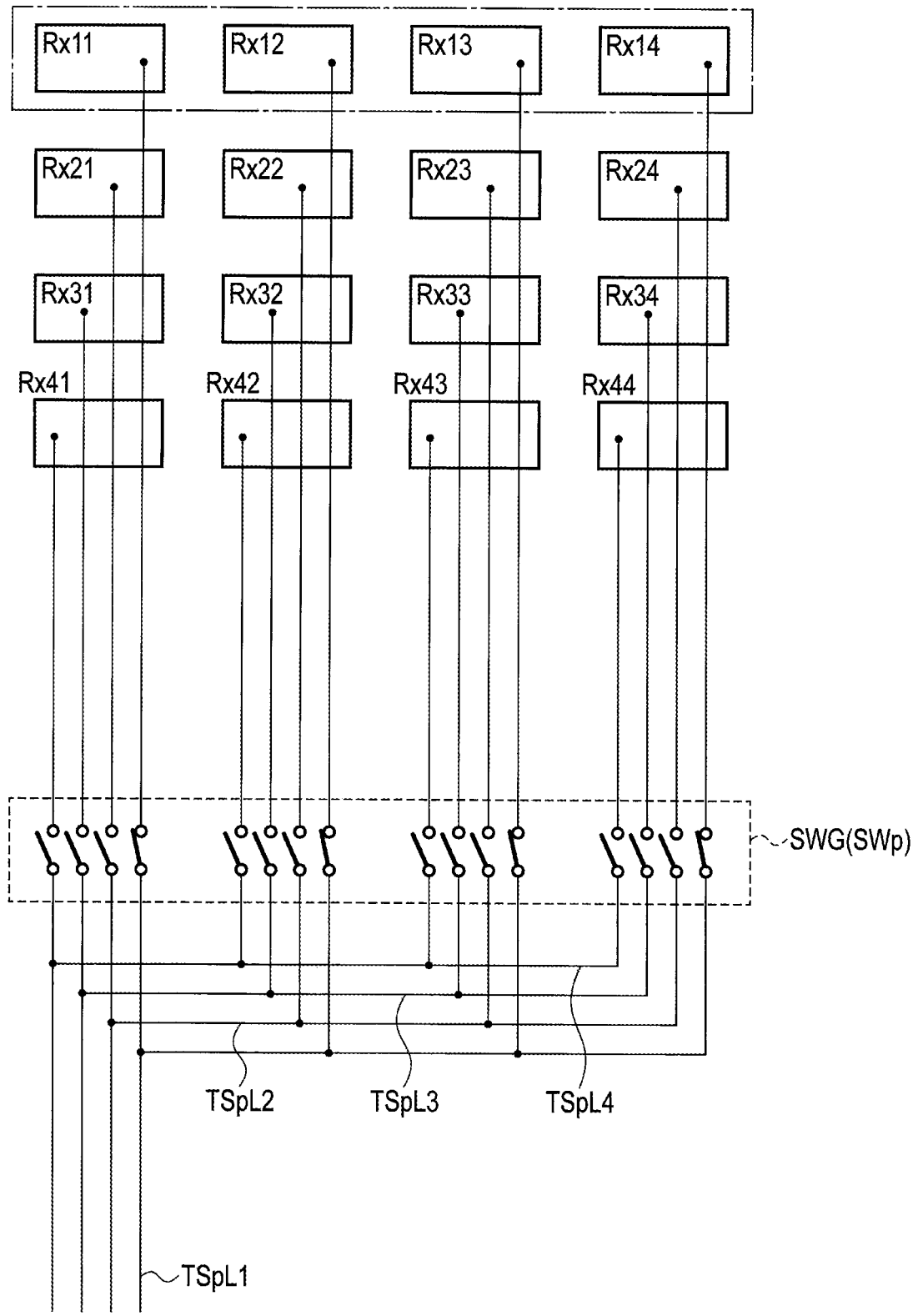
FIG. 19 is a circuit diagram showing another example of a layout of the common electrodes and the switch circuit group SWG.

FIG. 18 shows a modified example in which one drive signal line TSpL is connected to the detection electrodes Rx of all the rows of each column via the switches SWp in the switch circuit group SWG. For example, the drive signal TSpL1 is connected to the detection electrodes Rx11 to Rx41 of the first column of all the rows via the switch circuit group SWG. The drive signal TSpL2 is connected to the detection electrodes Rx12 to Rx42 of the second column of all the rows via the switch circuit group SWG. FIG. 19 shows a wiring example corresponding to FIG. 13 for comparison, i.e., a wiring example in which one drive signal line TSpL is connected to the detection electrodes Rx of all the columns of each row via the switch circuit group SWG. For example, the drive signal TSpL1 is connected to the detection electrodes Rx11 to Rx14 of all the columns of the first row via the switch circuit group SWG. In FIG. 18, the detection electrodes Rx connected to one drive signal line TSpL are arranged in the column direction (Y direction). In this case, in FIG. 18, since each of the drive signal lines TSpL1, TSpL2, TSpL3, and TSpL4 is merely connected to the drive electrodes of each column, in the non-display area NDA lower than the switch circuit group SWG, the non-display area NDA can be narrowed. In FIG. 19, since each of the drive signal lines TSpL1, TSpL2, TSpL3, and TSpL4 is connected to the drive electrodes of the first to fourth columns, in the non-display area NDA lower than the switch circuit group SWG, the non-display area NDA can hardly be narrowed.

Furthermore, in the configuration shown in FIG. 18, the resolution in the row direction (X direction) can be increased, in what is called bundle drive in which, by sequentially selecting the drive electrodes in each predetermined number in time division and applying the drive signal DSp to the selected drive electrodes, the scan drive is executed to make the scan pitch smaller than the full length of the predetermined number of drive electrodes.

FIG. 20 shows a modified example in which one drive signal line TSpL is connected to the detection electrodes Rx of plural rows of plural columns, for example, 2×2, via the switch circuit group SWG. For example, the drive signal TSpL1 is connected to four detection electrodes Rx11, Rx12, Rx21, and Rx22 of two rows x two columns via the switch circuit group SWG. In FIG. 20, the detection electrodes Rx connected to one drive signal line TSpL are arrayed in the X and Y directions. Is this configuration is what is called bundle drive, the resolution in the X and Y directions is uniform. For this reason, this configuration can be applied to not only detection of complete touch, but detection of hover mode which detects a state of being remote in a certain distance.

[Example of Wiring Layout on First Substrate SUB1]

Figure 21A:
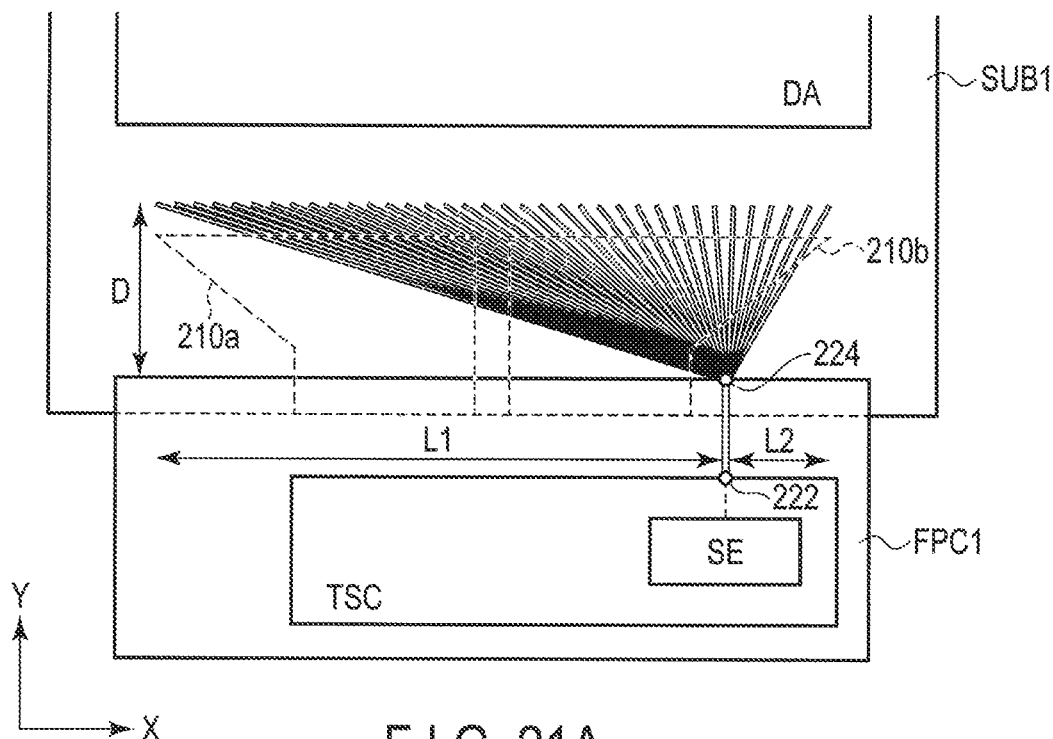
FIG. 21A is a diagram showing an example of a layout of drive signal lines on first substrate SUB1.

As shown in FIG. 2 and FIG. 4, the sensor SE is included in the touch sensing chip TSC which is the COF chip disposed on the flexible printed circuit FPC1. If the detection electrodes Rx are driven in CDM, a plurality of sensors SE connected to a plurality of detection electrodes Rx for each row are formed in the touch sensing chip TSC as shown in FIG. 13. The drive signals output from a plurality of sensors SE are supplied to a plurality of detection electrodes Rx via a plurality of drive signal lines TSpL and the switches SWp. The detection signals output from a plurality of detection electrodes Rx are also supplied to a plurality of sensors SE via a plurality of switches SWp and the drive signal lines TSpL. The guard signals output from a plurality of sensors SE are supplied to a plurality of detection electrodes Rx via a plurality of guard signal line TSnL and the switches SWn. A layout of the drive signal lines TSpL, the guard signal line TSnL, and the video signal on the first substrate SUB1 will be explained. FIG. 21A shows a wiring layout in a comparative example. An output terminal group 222 is connected to a plurality of sensors SE (only one sensor SE shown in FIG. 21A for convenience of explanations) in the touch sensing chip TSC. A number of drive signal lines TSpL and a guard signal line TSnL connected to the output terminal group 222 extend linearly in the Y direction on the flexible printed circuit FPC1, and are connected to a Film on Glass (FOG) pad group 224 formed at a connection with the first substrate SUB1. The video signal lines are also formed on the flexible printed circuit FPC1. Broken lines 210a and 210b on the first substrate SUB1 represent assemblies of a plurality of video signal lines and are not shown. Though not shown, a plurality of video signal lines 210a and 210b on the first substrate SUB1 also extend onto the flexible printed circuit FPC1. Upper ends of the video signal lines 210a and 210b are connected to a selector switch on a glass substrate of the first substrate SUB1, and lower ends of the video signal lines 210a and 210b are connected to the signal line driver SD. Since the drive signal lines TSpL and the guard signal line TSnL cannot intersect the video signal lines on the flexible printed circuit FPC1, the output terminal group 222 connected to a plurality of sensors SE may be provided at an end portion, for example, a right end or a left end inside the touch sensing chip TSC. For this reason, the FOG pad 224 of the flexible printed circuit FPC1 is also may be provided at the right end or the left.

A number of drive signal lines TSpL and a guard signal line TSnL expand radially from the FOG pad group 224 formed at one position on the first substrate SUB1 and are connected to the switches SWp and SWn. The switches SWp and SWn are connected to the detection electrodes. If the FOG pad group 224 is provided at the right end, the signal lines from the FOG pad group 224 to the left switches SWp and SWn are long. The long signal line has a high resistance value. For example, if the total number of drive signal lines TSpL and the guard signal line TSnL is thirty-six, the total of the resistance values of thirty-six drive signal lines TSpL and guard signal line TSnL connected to the switches SWp and SWn of thirty-six sensors SE can be obtained as mentioned below. The resistance values of the drive signal lines and the guard signal line are desirably low.

$$\text{Total of resistance values} = (R \times L1)/(D/(L1/(L1 + L2) \times N) - Sep) \quad \text{(Eq. 3)}$$

$$\approx 555 \, \Omega$$

R is a sheet resistance of the wiring layer of the drive signal line TSpL, L1 and L2 are parameters for defining an X-directional position of the FOG pad group 224, D is a Y-directional length of the drive signal lines TSpL/guard signal line TSnL on the first substrate SUB1, Sep is a separation between the lines of the drive signal lines TSpL/guard signal line TSnL, and N is the total number (36 in this example) of drive signal lines TSpL/guard signal line TSnL.

Figure 21B:
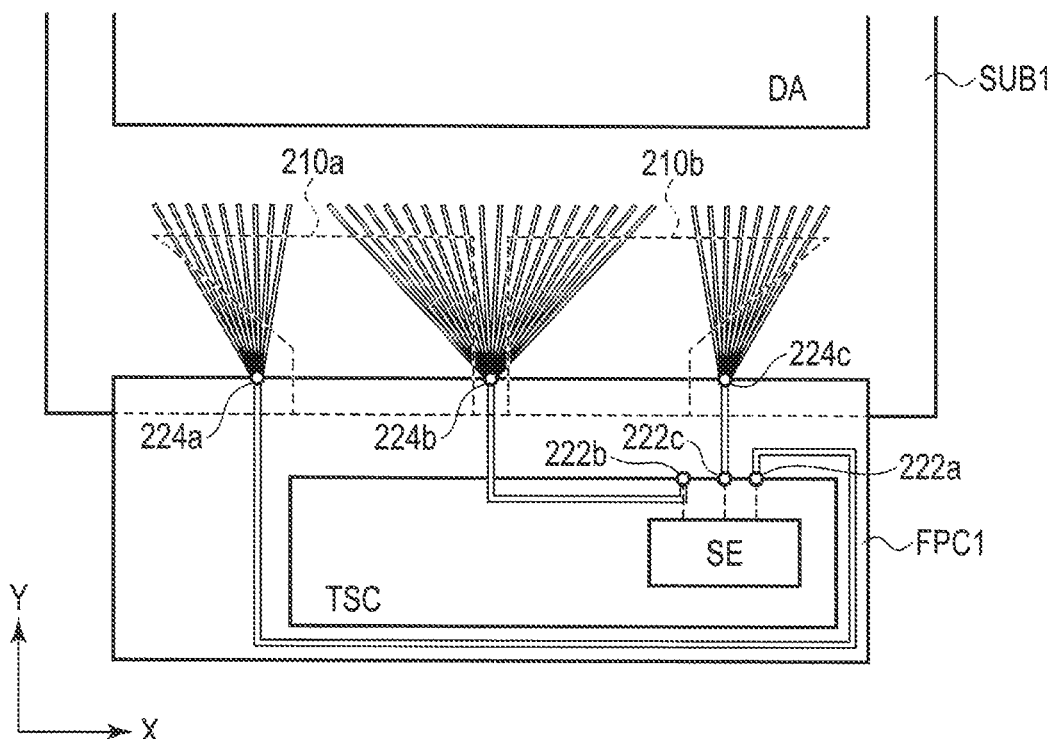
FIG. 21B is a diagram showing another example of a layout of drive signal lines on first substrate SUB1.

In the embodiment, since the area of the video signal lines 210a and 210b is divided into two areas in the X direction, three FOG pad groups 224a, 224b, and 224c of the flexible printed circuit FPC1 are separated at three positions, for example, a center, a left end, an a right end as shown in FIG. 21B. If the total number of drive signal lines TSpL and the guard signal line TSnL is thirty-six, eighteen FOG pads form a FOG pad group 224b at the center, nine FOG pads from a FOG pad group 224a at the left end, and nine FOG pads form a FOG pad group 224c at the right end. The output terminal group of the touch sensing chip TSC connected to the sensor SE is also divided into three output terminal groups 222a, 222b, and 222c connected to nine drive signal lines/guard signal line, eighteen drive signal lines/guard signal line, and nine drive signal lines/guard signal line. The output terminal groups 222a, 222b, and 222c are provided at an end portion, for example, a right end or a left end inside the touch sensing chip TSC, similarly to the comparative example.

Nine drive signal lines/guard signal line from the output terminal group 222c extend linearly in the Y direction on the flexible printed circuit FPC1 and are connected to the FOG pad group 224c at the right end, further expand radially on the first substrate SUB1 and are connected to the switches SWp and SWn located on the right side. Eighteen drive signal lines/guard signal line from the output terminal group 222b extend linearly in the X direction on the touch sensing chip TSC, extend from the center of the touch sensing chip TSC, linearly in the Y direction on the touch sensing chip TSC, and are connected to the FOG pad group 224b at the center. Eighteen drive signal lines/guard signal line expand from the FOG pad group 224b at the center, radially on the first substrate SUB1, and are connected to the switches SWp and SWn located at the center. Nine drive signal lines/guard signal line from the output terminal group 222a bypass the surrounding (upper, right, lower, and left sides) of the touch sensing chip TSC on the flexible printed circuit FPC1, extend linearly in the Y direction along the outer edge of the left end of the touch sensing chip TSC, and are connected to the FOG pad group 224a at the left end. Nine drive signal lines/guard signal line expand radially from the FOG pad group 224a at the left end and are connected to the switches SWp and SWn located on the left side.

The wiring lengths of the drive signal lines and the guard signal line from the FOG pad groups 224a, 224b, and 224c shown in FIG. 21B to the switches SWp and SWn can be made shorter as compared with those shown in FIG. 21A, by separating the FOG pad groups 224a, 224b, and 224c at three positions. Thus, if thirty-six drive signal lines and the guard signal line are classified into nine, eighteen, and eight signal lines, the total of the resistance values of the drive signal lines TSpL and the guard signal line TSnL becomes small, i.e., approximately 50Ω at maximum since L1 of (Equation 3) becomes shorter. If the FOG pad group is not provided at the center but the FOG pad groups are provided at two positions, i.e., right and left ends and thirty-six drive signal lines and the guard signal line are classified into eighteen signal lines and eighteen signal lines, the total of the resistance values of the drive signal lines and the guard signal line is approximately 135Ω, though not illustrated in the drawing.

As shown in FIG. 3, three wiring layers WL1, WL2, and WL3 are arranged in order on the insulating substrate 10, on the first substrate SUB1. The scanning lines GL are formed in the wiring layer WL1 which is the lowest and closest to the insulating substrate 10. The signal lines SL are formed in the wiring layer WL2. The common lines CML and the third metal lines 3M are formed in the uppermost wiring layer WL3.

Figure 22A:
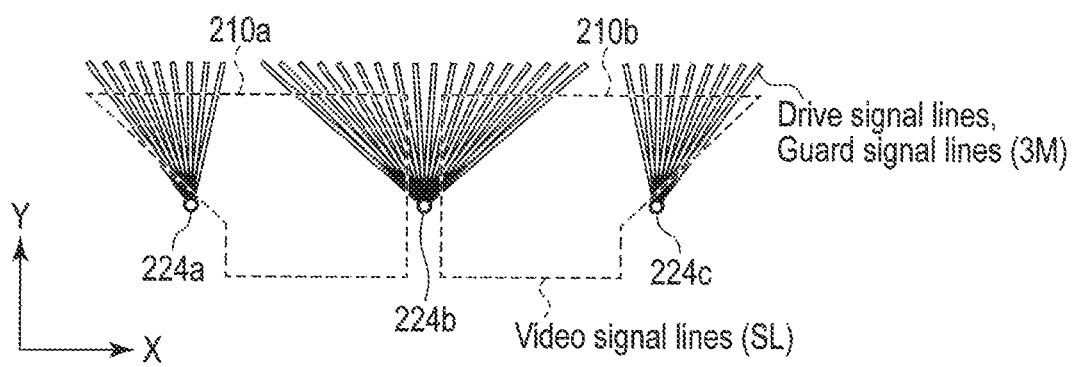
FIG. 22A is a diagram showing still another example of a layout of the drive signal lines on the first substrate SUB1.
Figure 22B:
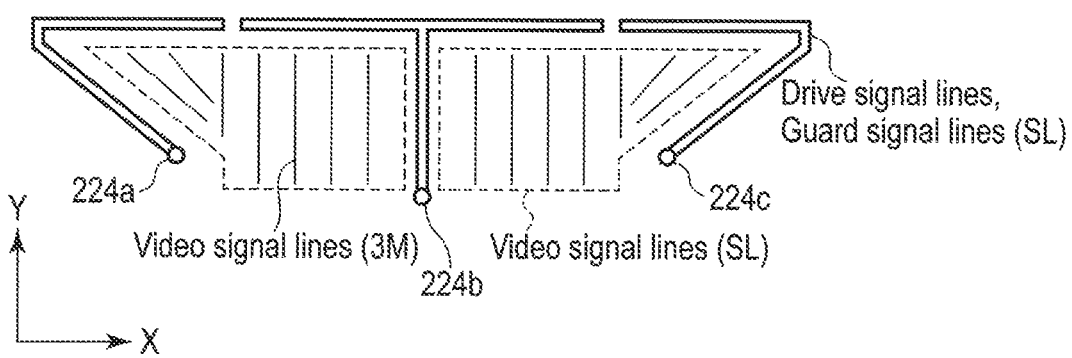
FIG. 22B is a diagram showing still another example of a layout of the drive signal lines on the first substrate SUB1.
Figure 22C:
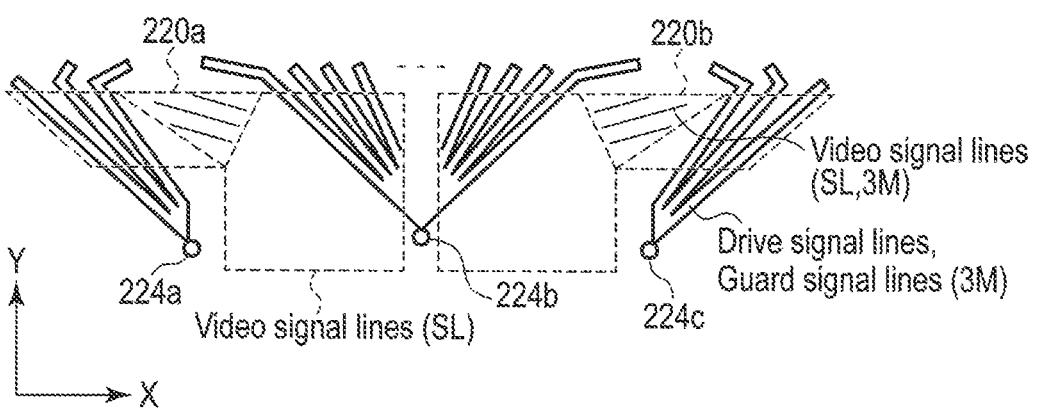
FIG. 22C is a diagram showing still another example of a layout of the drive signal lines on the first substrate SUB1.

FIGS. 22A, 22B, and 22C show a layout of the drive signal lines TSpL, the guard signal line TSnL, and the video signal lines on the first substrate SUB1 in a case where the FOG pad groups are disposed separately at three positions, i.e., the center, the left end, and the right end as shown in FIG. 21B.

In the example shown in FIG. 22A, the drive signal lines TSpL and the guard signal line TSnL are formed of the third metal lines 3M (see FIG. 3) in the wiring layer WL3, and the video signal lines 210a and 210b are formed of the signal lines SL (see FIG. 3) in the wiring layer WL2. Thus, since the drive signal lines TSpL, the guard signal line TSnL, and the video signal lines are formed in different wiring layers of the first substrate SUB1, the drive signal lines TSpL and the guard signal line TSnL expanding radially from the FOG pad groups 224a, 224b, and 224c to the switches SWp and SWn can be formed on the video signal lines 210a and 210b similarly to the signal lines shown in FIG. 21B.

In FIG. 22A, the video signal lines 210a and 210b are formed of a single-layer wiring, but the video signal lines may be multilayered. For example, the video signal lines may be formed of a two-layer structure composed of the signal lines SL of the wiring layer WL2 and the third metal lines 3M of the wiring layer WL3 or a three-layer structure composed of the scanning lines GL of the wiring layer WL1, the signal lines SL of the wiring layer WL2, and the third metal lines 3M of the wiring layer WL3. In this case, the drive signal lines TSpL and the guard signal line TSnL formed of the same wiring layer as the video signal lines cannot be formed on the video signal lines, and the drive signal lines TSpL and the guard signal line TSnL are formed while avoiding the video signal lines as shown in FIG. 22B or FIG. 22C.

In the example shown in FIG. 22B, the drive signal lines TSpL and the guard signal line TSnL are formed of the signal lines SL of the wiring layer WL2, and the video signal lines 210a and 210b are formed of the signal lines SL of the wiring layer WL2 at most parts, but are partially formed of a two-layer structure. For example, the video signal lines aligned at constant intervals in the X direction are formed of two layers by the signal lines SL of the wiring layer WL2 and the third metal lines 3M of the wiring layer WL3. For this reason, the Y-directional length of the area where the video signal lines 210a and 210b are formed, i.e., the width of the frame area is made smaller than that in the example shown in FIG. 22A. Thus, since the drive signal lines TSpL, the guard signal line TSnL, and the video signal lines are formed similarly in the wiring layer WL2 of the first substrate SUB1, the drive signal lines TSpL and the guard signal line TSnL cannot be expanded radially from the FOG pad groups 224a, 224b, and 224c to the switches SWp and SWn, on the video signal lines 210a and 210b, unlike the signal lines shown in FIG. 21B. For this reason, as shown in FIG. 22B, the drive signal lines TSpL and the guide signal line TSnL from the left and right FOG pad groups 224a and 224c are disposed to bypass the video signal lines 210a and 210b along the surrounding of the area where the video signal lines 210a and 210b are formed. The drive signal lines TSpL and the guide signal line TSnL are connected from the upper side (closer to the display area DA) of the area where the video signal lines 210a and 210b are formed to the left and right switches SWp and SWn. The drive signal lines TSpL and the guide signal line TSnL from the central FOG pad group 224b extend linearly in the Y direction between the areas where the video signal lines 210a and 210b are formed. The drive signal lines TSpL and the guide signal line TSnL are connected from the upper side (closer to the display area DA) of the area where the video signal lines 210a and 210b are formed to the switches SWp and SWn at the center. The video signal lines 210a and 210b are connected from the upper end to the switches SWp and SWn by the wirings in the scanning line GL layer of the first substrate SUB1.

In yet another example shown in FIG. 22C, the drive signal lines TSpL and the guard signal line TSnL are formed of the third metal lines 3M of the wiring layer WL3, the video signal lines 210a and 210b are formed of the signal lines SL of the wiring layer WL2 at most parts but the video signal lines 210a and 210b are formed of the two-layer structure by the signal lines SL of the wiring layer WL2 and the third metal lines 3M of the wiring layer WL3, in several parts of the areas 220a and 220b. For this reason, the width of the frame can be made smaller than that in the example shown in FIG. 22A, similarly to the example shown in FIG. 22B. The drive signal lines TSpL and the guard signal line TSnL from the FOG pad groups 224a, 224b, and 224c are formed radially on the video signal lines 210a and 210b other than the areas 220a and 220b so as not to cover the areas 220a and 220b.

Figure 23A:
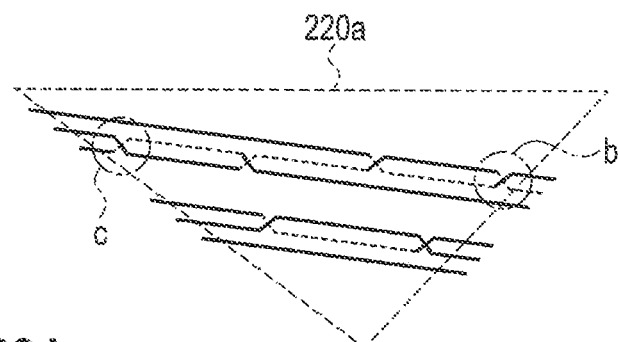
FIG. 23A is a diagram showing yet another example of a layout of the drive signal lines on the first substrate SUB1.
Figure 23B:
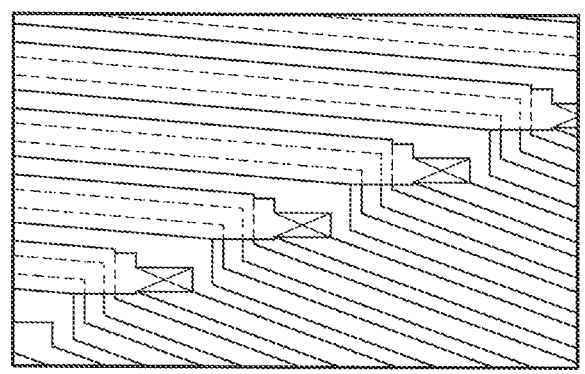
FIG. 23B is a diagram showing yet another example of a layout of the drive signal lines on the first substrate SUB1.
Figure 23C:
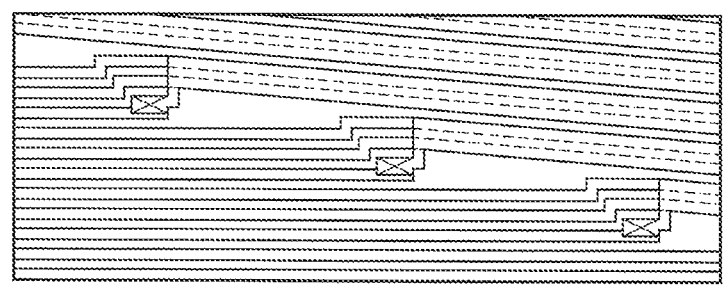
FIG. 23C is a diagram showing yet another example of a layout of the drive signal lines on the first substrate SUB1.

FIG. 23A is a plan view showing the area 220a (similar to 220b) shown in FIG. 22C. Solid lines represent the video signal lines composed of the signal lines SL of the wiring layer WL2, and broken lines represent the video signal lines composed of the third metal lines 3M of the wiring layer WL3. Thus, the video signal lines composed of the signal lines SL of the wiring layer WL2 are partially connected to the metal lines 3M of the wiring layer WL3, in the middle, and formed of the two-layer structure. FIG. 23B and FIG. 23C show enlarged views of "b" area and "c" area shown in FIG. 23A. In FIG. 23B and FIG. 23C, solid lines represent the video signal lines composed of the third metal lines 3M of the wiring layer WL3, and broken lines represent the video signal lines composed of the signal lines SL of the wiring layer WL2.

[Summary of Embodiments]

According to the embodiments, the following display device is provided.

(1) A display device comprising:
a display unit comprising electrodes Rx/CE two-dimensionally arrayed on a substrate SUB1;
a touch sensor SE configured to supply drive signals for touch detection to the electrodes Rx/CE and receive signals from the electrodes Rx/CE; and
a switch circuit group SWG comprising transistors SWd, SWn, and SWp connected between the touch sensor SE and the electrodes Rx/CE to select at least one of the electrodes, wherein
the transistors SWd, SWn, and SWp comprises a first transistor 164 connected to a first electrode of the electrodes Rx/CE via a line of a first length and a second transistor 161 connected to a second electrode of the electrodes Rx/CE via a line of a second length longer than the first length, and
a channel width W1 of the first transistor 164 is smaller than a channel width W2 of the second transistor 161.

(2) The display device of (1), wherein
the substrate SUB1 includes a display area DA and a frame area on a periphery of the display area DA,
the display unit is formed in the display area DA, and
the switch circuit group SWG is formed in the frame area.

(3) The display device of (2), wherein
the touch sensor SE is formed on a flexible printed circuit FPC1 connecting the substrate SUB1 and a host device.

(4) The display device of (3), wherein
the flexible printed circuit FPC1 comprises pads connected to the electrodes Rx/CE at a portion of connection to the substrate SUB1,
the touch sensor SE comprises detectors which are connected to the pads via signal lines, the detectors configured to supply drive signals to the pads and detect signals from the electrodes Rx/CE,
the pads are provided at two or more positions.

(5) The display device of (4), wherein
video signal lines configured to supply video signals to the electrodes Rx/CE are formed on the substrate SUB1,
the video signal lines are formed in two areas, and
the pads are provided between the two areas and an outer side of the two areas.

(6) The display device of (5), wherein
the substrate SUB1 comprises wiring layers,
the video signal lines are formed in a first wiring layer,
the signal lines are formed in a second wiring layer, and
the signal lines are formed to overlap the video signal line.

(7) The display device of (5), wherein
the substrate SUB1 comprises wiring layers,
the video signal lines comprise a potion formed in a first wiring layer and a portion formed in the first wiring layer and the second wiring layer,
the signal lines are formed in the first wiring layer or the second wiring layer, and
the signal lines do not overlap the video signal lines and are formed while bypassing the video signal lines.

(8) The display device of (2), further comprising:
a control signal generator CPG formed in the frame area and configured to control conduction of the transistors.

(9) The display device of (8), wherein
the control signal generator CPG is configured to simultaneously select a second number of electrodes Rx/CE, of a first number of electrodes Rx/CE arranged in a row, and change the selected electrodes Rx/CE to drive the second number of electrodes Rx/CE, based on a coding pattern, and
the touch sensor SE is configured to operate signals from the first number of electrodes Rx/CE, based on an inverse matrix of the coding pattern.

(10) The display device of (1), wherein
the touch sensor SE is configured to detect variation in electric capacitance of the electrodes Rx/CE in accordance with presence of an external object.

(11) The display device of (1), wherein
the touch sensor SE comprises detectors,
each of the detectors is connected to electrodes Rx/CE arranged in each row, electrodes Rx/CE arranged in each column, or electrodes Rx/CE arranged in plural rows and plural columns.
(12) A display device comprising:
a display unit comprising electrodes Rx/CE two-dimensionally arrayed on a substrate SUB1;
a touch sensor SE configured to supply drive signals for touch detection to the electrodes Rx/CE and receive signals from the electrodes Rx/CE, the touch sensor being formed on a flexible printed circuit FPC1 connecting the substrate SUB1 and a host device; and
a switch circuit group SWG comprising transistors SWd, SWn, and SWp connected between the touch sensor SE and the electrodes Rx/CE to select at least one of the electrodes Rx/CE, wherein
the flexible printed circuit FPC1 comprises pads connected to the electrodes Rx/CE at a portion of connection to the substrate SUB1,
the touch sensor SE comprises detectors which are connected to the pads via signal lines, the detectors configured to supply drive signals to the pads and detect signals from the electrodes Rx/CE, and
the pads are provided at two or more positions.
(13) The display device of (12), wherein
video signal lines configured to supply video signals to the electrodes Rx/CE are formed on the substrate SUB1,
the video signal lines are formed in two areas, and
the pads are provided between the two areas and an outer side of the two areas.
(14) The display device of (13), wherein
the substrate SUB1 comprises wiring layers,
the video signal lines are formed in a first wiring layer,
the signal lines are formed in a second wiring layer, and
the signal lines are formed to overlap the video signal lines.
(15) The display device of (13), wherein
the substrate SUB1 comprises wiring layers,
the video signal lines comprise a potion formed in a first wiring layer and a portion formed in the first wiring layer and the second wiring layer,
the signal lines are formed in the first wiring layer or the second wiring layer, and
the signal lines do not overlap the video signal lines and are formed while bypassing the video signal lines.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:
1. A display device comprising:
a substrate;
a first common electrode arranged in a first row on a first layer on the substrate;
a second common electrode arranged in a second row on the first layer;
a plurality of the pixel electrodes arranged over the first common electrode and the second common electrode;
an insulating layer arranged between the plurality of the pixel electrodes and the first common electrode and between the plurality of the pixel electrodes and the second common electrode;
a first line having a first terminal and the second terminal, the first terminal connected to the first common electrode;
a second line having a first terminal and the second terminal, the first terminal connected to the second common electrode;
a first transistor connected to the second terminal of the first line; and
a second transistor connected to the second terminal of the second line,
wherein
the first common electrode, the second common electrode, and the plurality of the pixel electrodes are arranged in a display area,
the first transistor and the second transistor are arranged outside the display area,
the second line is longer than the first line, and
a channel width of the first transistor is smaller than a channel width of the second transistor.
2. The display device of claim 1, further comprising:
a touch sensor circuit configured to supply drive signals for touch detection to the first common electrode and the second common electrode and to receive signals from the first common electrode and the second common electrode.
3. The display device of claim 2, wherein
the touch sensor circuit is formed on a flexible printed circuit connecting the substrate and a host device.
4. The display device of claim 3, further comprising:
a control signal generator configured to control conduction of the first transistor and the second transistor.
5. A display device comprising:
a first substrate;
a first electrode arranged in a first row on a first layer on the first substrate;
a second electrode arranged in a second row on the first layer;
a first line having a first terminal and a second terminal, the first terminal connected to the first electrode;
a second line having a first terminal and a second terminal, the first terminal connected to the second electrode;
a first transistor connected to the second terminal of the first line;
a second transistor connected to the second terminal of the second line;
a second substrate; and
a liquid crystal layer arranged between the first substrate and the second substrate,
wherein
the first electrode and the second electrode are arranged in a display area,
the first transistor and the second transistor are arranged outside the display area,
the second line is longer than the first line, and
a channel width of the first transistor is smaller than a channel width of the second transistor.
6. The display device of claim 5, further comprising:
a touch sensor circuit configured to supply drive signals for touch detection to the first electrode and the second electrode and to receive signals from the first electrode and the second electrode.

7. The display device of claim 6, wherein
the touch sensor circuit is formed on a flexible printed circuit connecting the first substrate and a host device.

8. The display device of claim 7, further comprising:
a control signal generator configured to control conduction of the first transistor and the second transistor.

9. The display device of claim 5, wherein
the second substrate includes an insulating substrate having a light transmitting property.

10. The display device of claim 9, wherein
the second substrate includes color filters, an overcoat layer, an alignment film, a conductive film, and a black matrix.

\* \* \* \* \*